US012660453B2

(12) United States Patent
Gao et al.

(10) Patent No.: US 12,660,453 B2
(45) Date of Patent: Jun. 16, 2026

(54) DISPLAY SUBSTRATE AND DISPLAY APPARATUS EACH HAVING FIRST POWER SUPPLY PINS CONNECTED WITH FIRST POWER SUPPLY LINE

(71) Applicants: Chengdu BOE Optoelectronics Technology Co., Ltd., Chengdu (CN); BOE Technology Group Co., Ltd., Beijing (CN)

(72) Inventors: Wenhui Gao, Beijing (CN); Peng Xu, Beijing (CN); Siyu Wang, Beijing (CN); Lingran Wang, Beijing (CN); Caifeng Zhang, Beijing (CN); Kai Zhang, Beijing (CN); Shilong Wang, Beijing (CN); Tiaomei Zhang, Beijing (CN); Zhiliang Jiang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 1057 days.

(21) Appl. No.: 17/780,033

(22) PCT Filed: Jun. 4, 2021

(86) PCT No.: PCT/CN2021/098447
§ 371 (c)(1),
(2) Date: Dec. 8, 2022

(87) PCT Pub. No.: WO2022/252230
PCT Pub. Date: Dec. 8, 2022

(65) Prior Publication Data
US 2024/0237449 A1 Jul. 11, 2024

(51) Int. Cl.
*H10K 59/131* (2023.01)
*H10K 59/80* (2023.01)

(52) U.S. Cl.
CPC ....... *H10K 59/1315* (2023.02); *H10K 59/131* (2023.02); *H10K 59/8731* (2023.02)

(58) Field of Classification Search
CPC ............. H10K 59/1315; H10K 59/131; H10K 59/8731
See application file for complete search history.

(56) References Cited

U.S. PATENT DOCUMENTS

2014/0146025 A1 5/2014 Shi et al.
2017/0288008 A1 10/2017 Kim et al.
(Continued)

FOREIGN PATENT DOCUMENTS

CN 102799005 A 11/2012
CN 103000152 A 3/2013
(Continued)

*Primary Examiner* — Michael Jung
(74) *Attorney, Agent, or Firm* — Ling Wu; Stephen Yang; Ling and Yang Intellectual Property

(57) ABSTRACT

Disclosed are a display substrate, a preparation method thereof, and a display apparatus. The display substrate includes a display region and a non-display region surrounding the display region, wherein the non-display region includes a first border region at least partially surrounding the display region, a second border region and a lead convergence region located on a side of the display region, the lead convergence region is located between the first border region and the second border region, and the lead convergence region includes two corner regions and an intermediate convergence region located between the two corner regions; a plurality of data line leads, at least located in the first border region and the lead convergence region, and electrically connected with a plurality of data lines in the display region.

18 Claims, 10 Drawing Sheets

(56)          References Cited

U.S. PATENT DOCUMENTS

| | | | |
|---|---|---|---|
| 2019/0259967 A1 | 8/2019 | Yang | |
| 2020/0203643 A1 | 6/2020 | Choi et al. | |
| 2020/0373375 A1 | 11/2020 | Na et al. | |
| 2020/0388665 A1 | 12/2020 | Jung et al. | |
| 2021/0036091 A1* | 2/2021 | Kwak | H10K 59/131 |
| 2021/0091164 A1* | 3/2021 | Kim | H10K 59/131 |
| 2021/0098550 A1* | 4/2021 | Moon | H10K 59/131 |
| 2021/0376039 A1* | 12/2021 | Jo | H10K 77/111 |
| 2022/0102689 A1 | 3/2022 | Jiang et al. | |

FOREIGN PATENT DOCUMENTS

| | | | |
|---|---|---|---|
| CN | 109065571 A | 12/2018 |
| CN | 109100896 A | 12/2018 |
| CN | 109686758 A | 4/2019 |
| CN | 110634887 A | 12/2019 |
| CN | 111933674 A | 11/2020 |
| CN | 111969006 A | 11/2020 |
| CN | 112151445 A | 12/2020 |
| CN | 112530992 A | 3/2021 |
| CN | 112667107 A | 4/2021 |

* cited by examiner

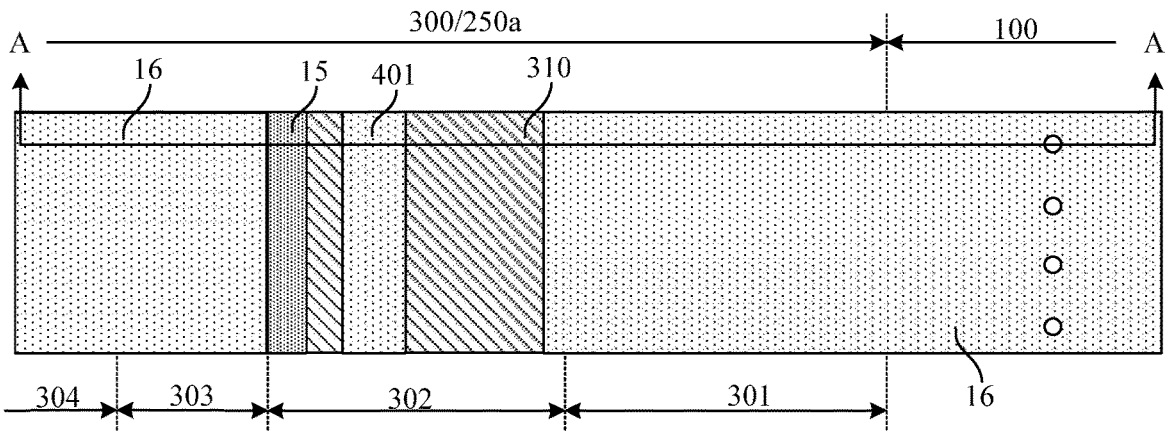
FIG. 9a
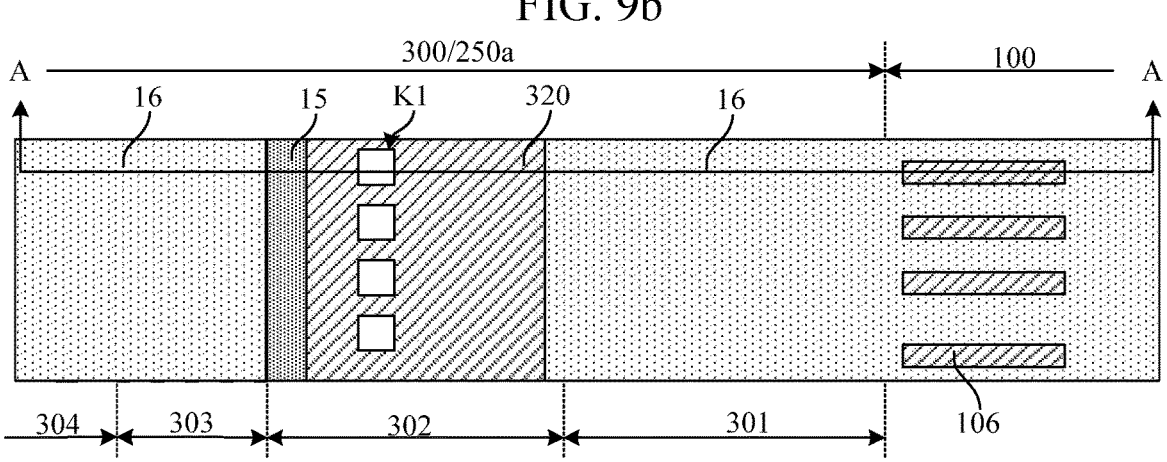
FIG. 9b
FIG. 10a

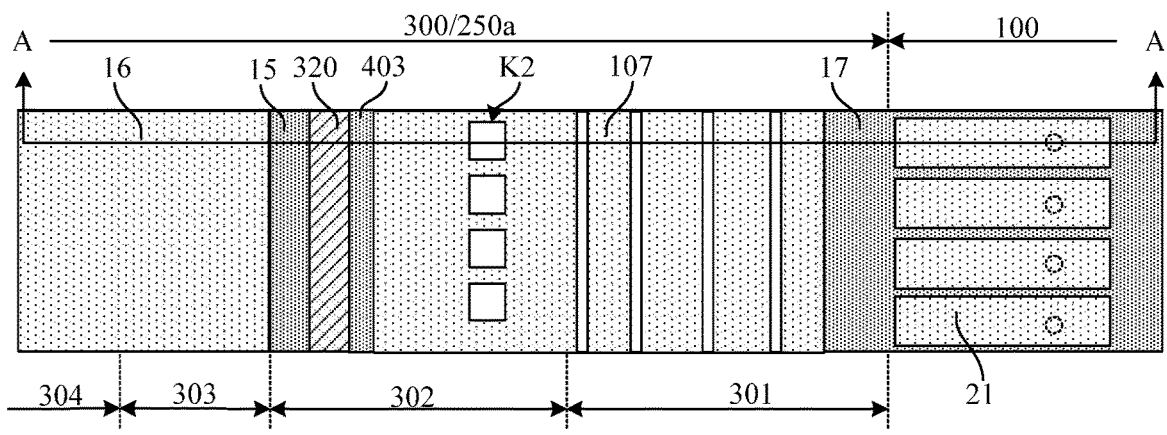
FIG. 12a
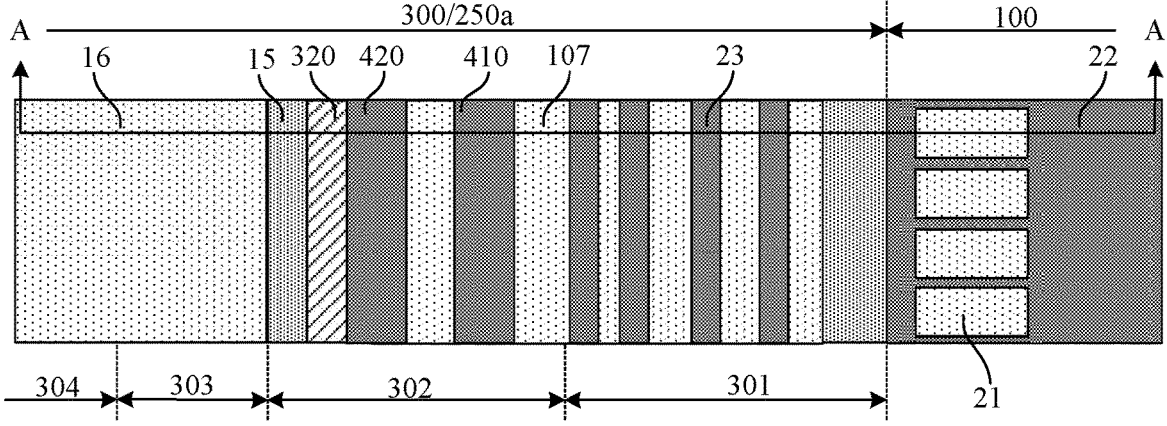
FIG. 12b
FIG. 13a

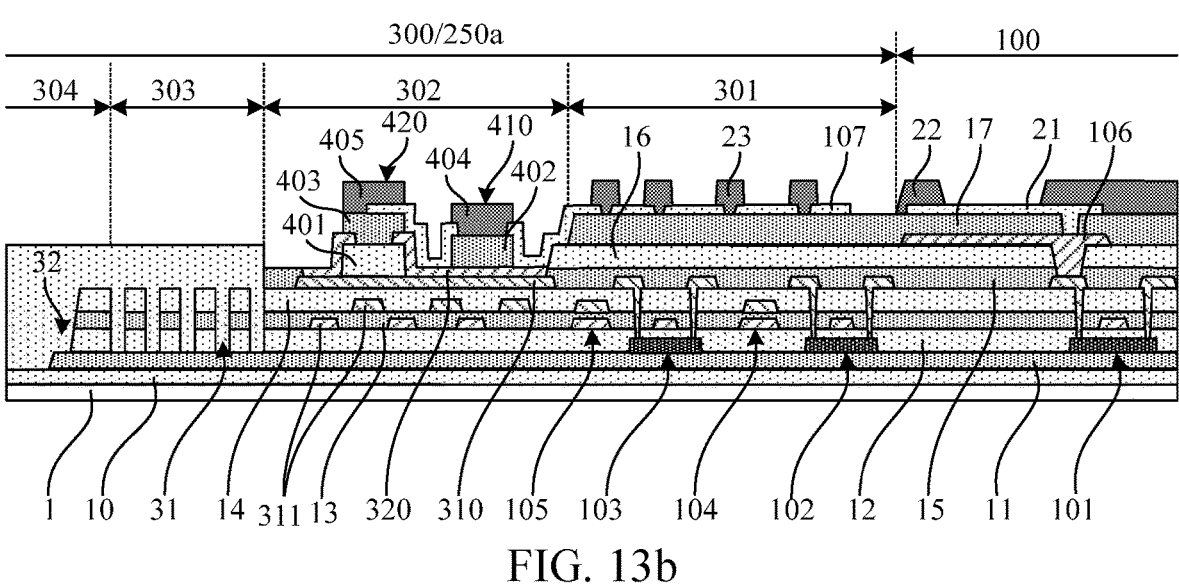
FIG. 13b
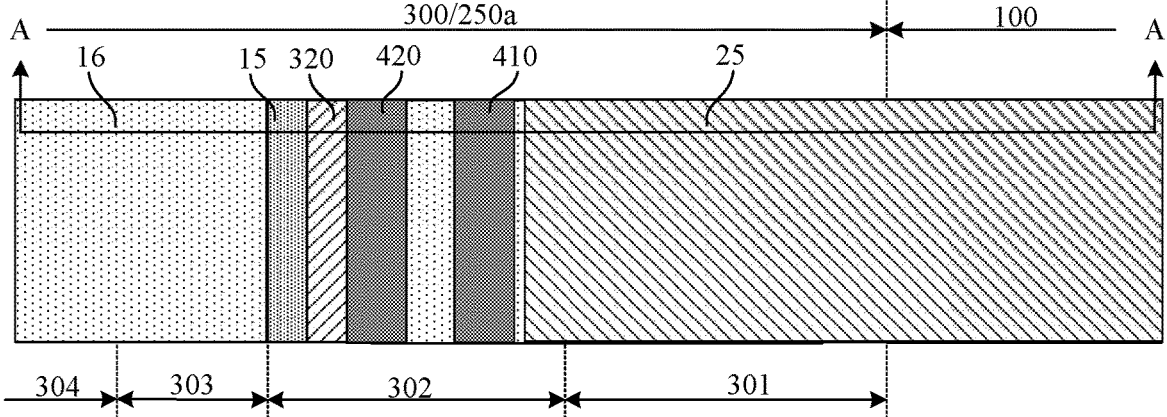
FIG. 14a
FIG. 14b

DISPLAY SUBSTRATE AND DISPLAY APPARATUS EACH HAVING FIRST POWER SUPPLY PINS CONNECTED WITH FIRST POWER SUPPLY LINE

CROSS-REFERENCE TO RELATED APPLICATION

The present application is a U.S. National Phase Entry of International Application No. PCT/CN2021/098447 having an international filing date of Jun. 4, 2021. The above-identified application is hereby incorporated by reference.

TECHNICAL FIELD

Embodiments of the present disclosure relate to, but are not limited to, the field of display technologies, in particular to a display substrate and a display apparatus.

BACKGROUND

An Organic Light Emitting Diode (OLED for short) and a Quantum dot Light Emitting Diode (QLED for short) are active light emitting display devices and have advantages of self-luminescence, a wide viewing angle, a high contrast ratio, low power consumption, an extremely high response speed, lightness and thinness, flexibility, and a low cost, etc. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. This summary is not intended to limit the scope of protection of claims.

Exemplary embodiments of the present disclosure provide a display substrate, including: a base substrate, including a display region and a non-display region surrounding the display region, wherein the non-display region includes a first border region at least partially surrounding the display region, a second border region and a lead convergence region located on a side of the display region, the lead convergence region is located between the first border region and the second border region, and the lead convergence region includes a first corner region, a second corner region, and an intermediate convergence region located between the first corner region and the second corner region; a plurality of sub-pixels, located in the display region; a plurality of data lines, located in the display region and electrically connected with the plurality of sub-pixels; a plurality of data line leads, at least located in the first border region and the lead convergence region, and electrically connected with the plurality of data lines; a first power supply line, located in the first border region and the lead convergence region, wherein the first power supply line at least partially surrounds the display region; and at least two first power supply pins, located in the second border region, wherein the at least two first power supply pins are connected with the first power supply line; an orthographic projection of the first power supply line on a plane of the base substrate of the first border region, the first corner region, and the second corner region is overlapped at least partially with an orthographic projection of the plurality of data line leads on the plane of the base substrate.

In an exemplary embodiment, the first power supply line includes a first boundary close to the display region and a second boundary away from the display region in the first border region and the first corner region; the plurality of data line leads includes a first data line lead group located in the first border region and the first corner region, and the first data line lead group includes a third boundary close to the display region and a fourth boundary away from the display region.

In an exemplary embodiment, at least part of the third boundary is located on a side of the first boundary close to the display region, and a shortest distance between the first boundary and the third boundary is between 5 microns and 10 microns.

In an exemplary embodiment, a width of the first power supply line is between 200 and 350 microns.

In an exemplary embodiment, at least part of the first boundary is located on a side of the third boundary close to the display region, and a shortest distance between the first boundary and the third boundary is between 2 microns and 5 microns.

In an exemplary embodiment, the fourth boundary is located on a side of the second boundary close to the display region, and a shortest distance between the second boundary and the fourth boundary is between 10 microns and 25 microns.

In an exemplary embodiment, the fourth boundary is located on a side of the second boundary close to the display region, and a ratio of a width of the first power supply line to a maximum width of the plurality of data line leads ranges from 1.1 to 1.2.

In an exemplary embodiment, the first boundary is located on a side of the third boundary close to the display region, and the second boundary is located on a side of the fourth boundary away from the display region.

In an exemplary embodiment, the first power supply line further includes a fifth boundary close to the display region and a sixth boundary away from the display region in the first border region and the second corner region; the plurality of data line leads further include a second data line group located in the first border region and the second corner region, and the second data line lead group includes a seventh boundary close to the display region and an eighth boundary away from the display region.

In an exemplary embodiment, the display region includes a centerline, the centerline is a straight line extending along a first direction and equally dividing the display region, and the second data line group and the first data line group are disposed symmetrically with respect to the centerline.

In an exemplary embodiment, at least part of the seventh boundary is located on a side of the fifth boundary close to the display region, and a shortest distance between the seventh boundary and the fifth boundary is between 5 microns and 10 microns.

In an exemplary embodiment, at least part of the fifth boundary is located on a side of the seventh boundary close to the display region, and a shortest distance between the fifth boundary and the seventh boundary is between 2 microns and 5 microns.

In an exemplary embodiment, the eighth boundary is located on a side of the sixth boundary close to the display region, and a shortest distance between the sixth boundary and the eighth boundary is between 10 microns and 25 microns.

In an exemplary embodiment, the eighth boundary is located on a side of the sixth boundary close to the display region, and a ratio of a width of the first power supply line to a maximum width of the plurality of data line leads ranges from 1.1 to 1.2.

In an exemplary embodiment, the fifth boundary is located on a side of the seventh boundary close to the display region, and the sixth boundary is located on a side of the eighth boundary away from the display region.

In an exemplary embodiment, in a plane perpendicular to the display substrate, the display substrate includes the base substrate, and a drive circuit layer, a light emitting structure layer, and an encapsulation layer that are stacked on the base substrate, the drive circuit layer includes an active layer, a first gate metal layer, a second gate metal layer, a first source drain metal layer, and a second source drain metal layer that are stacked on the base substrate; and the light emitting structure layer includes an anode, a cathode, and an organic light emitting layer disposed between the anode and the cathode; and the data line leads are disposed in a same layer as one or more of the first gate metal layer and the second gate metal layer, and the first power supply line is disposed in a same layer as at least one of the first source drain metal layer, the second source drain metal layer, and the anode.

In an exemplary embodiment, the data line leads include a first data line lead and a second data line lead disposed alternately along a direction away from the display region, the first data line lead is disposed in a same layer as the first gate metal layer, the second data line lead is disposed in a same layer as the second gate metal layer, and an orthographic projection of the first data line lead on the plane of the base substrate is not overlapped with an orthographic projection of the second data line lead on the plane of the base substrate.

In an exemplary embodiment, the first border region and the lead convergence region further include a isolating dam surrounding the display region, the isolating dam includes a first isolating dam and a second isolating dam, a distance between the first isolating dam and an edge of the display region is less than a distance between the second isolating dam and the edge of the display region, and orthographic projections of the first isolating dam and the second isolating dam on the plane of the base substrate is within a range of the orthographic projection of the first power supply line on the plane of the base substrate.

In an exemplary embodiment, the display substrate further includes a second power supply line located in the lead convergence region and the second border region, and an orthographic projection of the second power supply line on the plane of the base substrate of the lead convergence region is overlapped at least partially with the orthographic projection of the plurality of data line leads on the plane of the base substrate.

An exemplary embodiment of the present disclosure further provides a display apparatus, including the foregoing display substrate.

Other aspects may be comprehended upon reading and understanding the drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the accompanying drawings do not reflect actual scales and are only intended to illustrate contents of the present disclosure.

FIG. 5b is a schematic diagram of an enlarged structure of a region B in FIG. 5a.

FIG. 7b is a cross-sectional view taken along a direction A-A in FIG. 7a.

FIG. 8b is a cross-sectional view taken along a direction A-A in FIG. 8a.

FIG. 9a is a schematic diagram of a display substrate after a pattern of a first planarization layer is formed according to the present disclosure.

FIG. 9b is a sectional view taken along a direction A-A in FIG. 9a.

FIG. 10a is a schematic diagram of a display substrate after a pattern of a second source drain metal layer is formed according to the present disclosure.

FIG. 10b is a sectional view taken along a direction A-A in FIG. 10a.

FIG. 11b is a cross-sectional view taken along a direction A-A in FIG. 11a.

FIG. 12a is a schematic diagram of a display substrate after patterns of an anode and a second connection electrode are formed according to the present disclosure.

FIG. 12b is a cross-sectional view taken along a direction A-A in FIG. 12a.

FIG. 13a is a schematic diagram of a display substrate after patterns of a Pixel Definition Layer and a Post Spacer are formed according to the present disclosure.

FIG. 13b is a cross-sectional view taken along a direction A-A in FIG. 13a.

FIG. 14a is a schematic diagram of a display substrate after patterns of an organic light emitting layer and a cathode are formed according to the present disclosure.

FIG. 14b is a cross-sectional view taken along a direction A-A in FIG. 14a.

DETAILED DESCRIPTION

Figure 1:
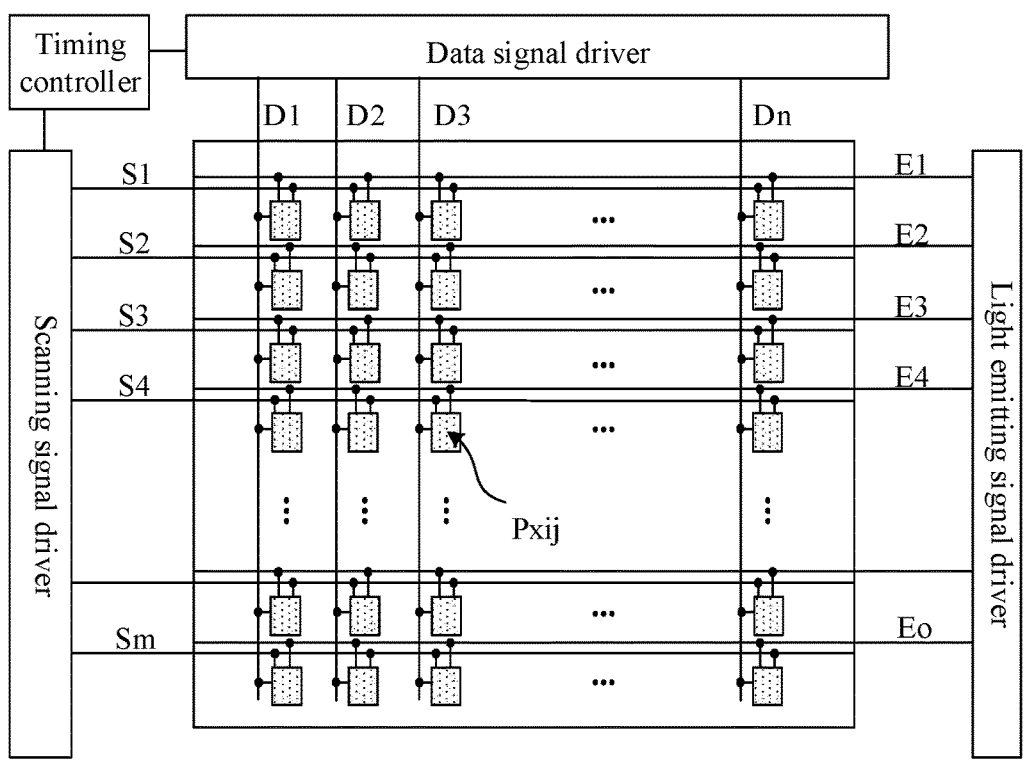
FIG. 1 is a schematic diagram of a structure of an Organic Light Emitting Diode (OLED) display apparatus.

Embodiments of the present disclosure will be described in detail below in combination with the drawings. It is to be noted that implementation modes may be implemented in multiple different forms. Those of ordinary skill in the art may easily understand such a fact that manners and contents may be transformed into various forms without departing from purposes and scope of the present disclosure. Therefore, the present disclosure should not be interpreted as being limited to the contents recorded in the following implementations only. The embodiments in the present disclosure and features in the embodiments may be arbitrarily combined with each other if there are no conflicts. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

Sometimes for clarity, sizes of various constituent elements, thicknesses of layers or areas in the drawings may be exaggerated. Therefore, one implementation mode of the present disclosure is not necessarily limited to the size, and shapes and sizes of various components in the drawings do not reflect actual scales. In addition, the drawings schematically illustrate ideal examples, and an implementation of the present disclosure is not limited to the shapes, numerical values, or the like shown in the drawings.

Ordinal numerals such as "first", "second", "third", 1st, 2nd, and 3rd in the specification are not set to form limits in number but only to avoid confusion between constituent elements.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to the direction in which the various constituent elements are described. Therefore, the position relationships between the constituent elements are not limited to the words and phrases used in the specification, and appropriate substitutions may be made according to situations.

In the specification, unless otherwise specified and defined explicitly, terms "mount", "mutually connect", and "connect" should be understood in a broad sense. For example, the connection may be a fixed connection, a detachable connection or an integrated connection, or may be a mechanical connection or an electrical connection, or may be a direct connection, an indirect connection through intermediate components, or communication inside two components. For those of ordinary skills in the art, meanings of the above-mentioned terms in the present disclosure may be understood according to situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region that the current mainly flows through.

In the specification, a first electrode may be the drain electrode, and a second electrode may be the source electrode. Or, the first electrode may be the source electrode, and the second electrode may be the drain electrode. In the case that transistors with opposite polarities are used or that a current direction is changed during circuit operation, functions of "the source electrode" and "the drain electrode" may sometimes be exchanged. Therefore, the "source electrode" and the "drain electrode" may be exchanged in the present specification.

In the specification, "electrical connection" includes a case that constituent elements are connected together through an element with a certain electrical effect. The "element with a certain electric action" is not particularly limited as long as it allows sending and receiving of electric signals between the connected constituent elements. Examples of the "element with a certain electric action" include not only an electrode and wiring, but also a switching element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. As shown in FIG. 1, an OLED display apparatus may include a timing controller, a data signal driver, a scanning signal driver, a light emitting signal driver, and a pixel array. The pixel array may include a plurality of scanning signal lines (S1 to Sm), a plurality of data lines (D1 to Dn), a plurality of light emitting signal lines (E1 to Eo), and a plurality of sub-pixels Pxij. In an exemplary embodiment, the timing controller may provide a gray-scale value and a control signal suitable for a specification of the data signal driver to the data signal driver, provide a clock signal, a scan starting signal, etc., suitable for a specification of the scanning signal driver to the scanning signal driver, and provide a clock signal, an emission stopping signal, etc., suitable for a specification of the light emitting signal driver to the light emitting signal driver. The data signal driver may generate a data voltage to be provided to the data signal lines D1, D2, D3, . . . , and Dn using the gray-scale value and the control signal that are received from the timing controller. For example, the data signal driver may sample the gray-scale value using the clock signal and apply the data voltage corresponding to the gray-scale value to the data lines D1 to Dn by taking a sub-pixel row as a unit, where n may be a natural number. The scanning signal driver may receive the clock signal, the scan starting signal, etc., from the timing controller to generate a scanning signal to be provided to the scanning signal lines S1, S2, S3, . . . , and Sm. For example, the scanning signal driver may sequentially provide a scanning signal with an on-level pulse to the scanning signal lines S1 to Sm. For example, the scanning signal driver may be constructed in a form of a shift register, and generate a scanning signal in a manner of sequentially transmitting the scan starting signal provided in a form of an on-level pulse to a next-stage circuit under control of the clock signal, wherein m may be a natural number. The light emitting signal driver may receive the clock signal, the emission stopping signal, etc., from the timing controller to generate an emission signal to be provided to the light emitting signal lines E1, E2, E3, . . . , and Eo. For example, the light emitting signal driver may sequentially provide an emission signal with an off-level pulse to the light emitting signal lines E1 to Eo. For example, the light emitting signal driver may be constructed in a form of a shift register, and generate a light emitting signal in a manner of sequentially transmitting a light emitting stopping signal provided in a form of an off-level pulse to a next-stage circuit under control of the clock signal, wherein o may be a natural number. The pixel array may include a plurality of sub-pixels Pxij. Each sub-pixel Pxij may be connected with a corresponding data line, a corresponding scanning signal line, and a corresponding light emitting signal line, where i and j may be natural numbers. The sub-pixel Pxij may refer to a sub-pixel in which a transistor is connected with an i-th scanning signal line as well as a j-th data line.

Figure 2:
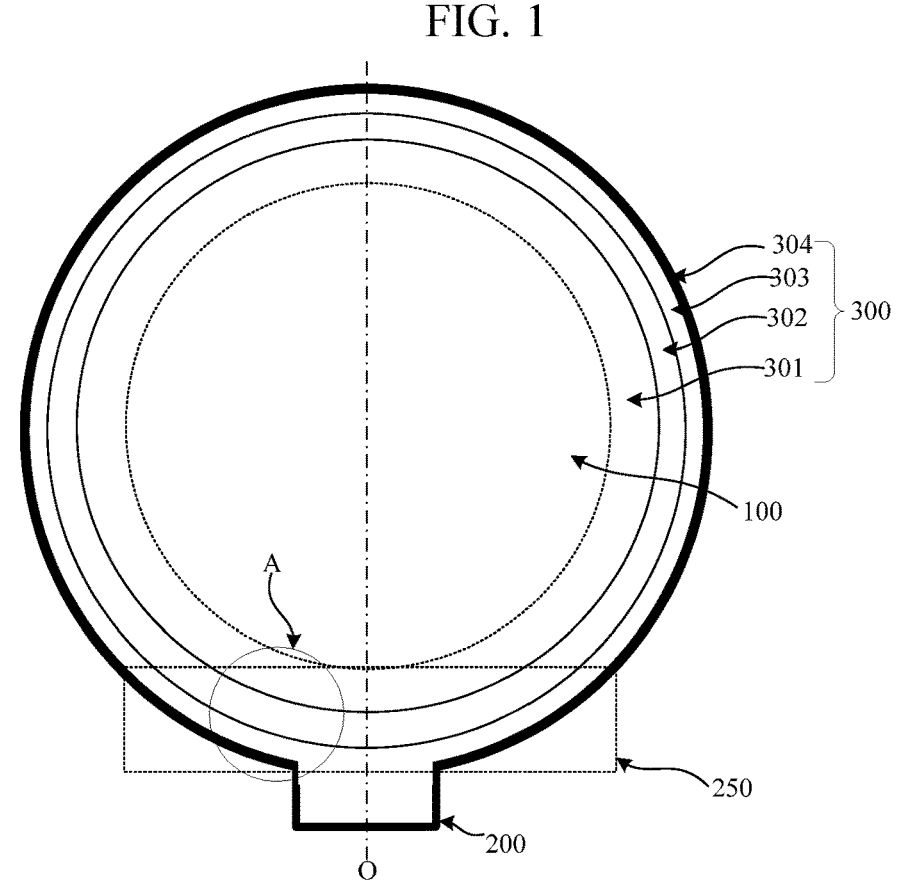
FIG. 2 is a schematic diagram of a structure of a display substrate according to an exemplary embodiment of the present disclosure.

FIG. 2 is a schematic diagram of a planar structure of a display substrate according to an exemplary embodiment of the present disclosure. As shown in FIG. 2, the display substrate may include a display region 100 and a non-display region surrounding the display region 100, and the non-display region includes a first border region 300 at least partially surrounding the display region 100, a second border region 200 located on a side of the display region 100, and a lead convergence region 250 located between the first border region 300 and the second border region 200. The display region 100 may include a plurality of sub-pixels configured to display a dynamic picture or a static image. The lead convergence region 250 may include data fan-out lines connecting a plurality of data lines to an integrated circuit, the first border region 300 may include a first power supply line for transmitting a voltage signal, and the lead convergence region 250 and the first border region 300 may include an isolating dam of an annular structure.

Figure 3:
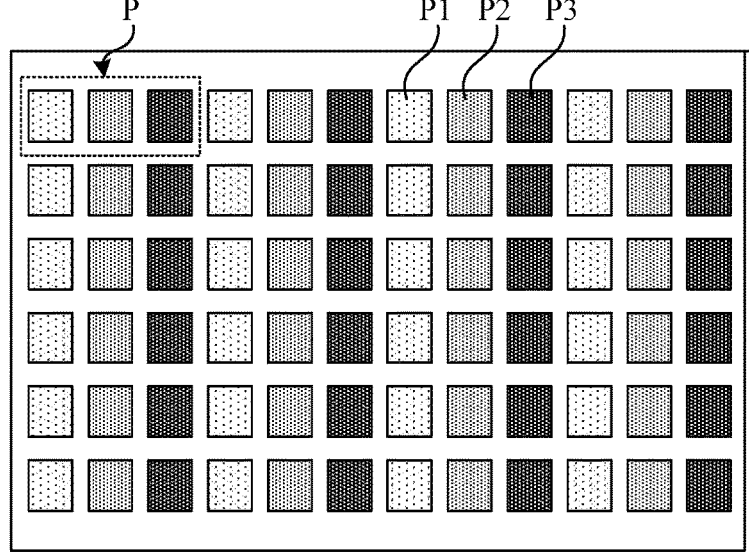
FIG. 3 is a schematic diagram of a pixel arrangement structure of a display region according to an exemplary embodiment of the present disclosure.

In an exemplary embodiment, the display region 100 may include a plurality of pixel units arranged in a matrix. FIG. 3 is a schematic diagram of a pixel arrangement structure of a display region 100 according to an exemplary embodiment of the present disclosure. As shown in FIG. 3, a display substrate may include a plurality of pixel units P arranged in a matrix, at least one of the plurality of pixel units P includes a first color sub-pixel P1 emitting light of a first color, a second color sub-pixel P2 emitting light of a second color, and a third color sub-pixel P3 emitting light of a third color, and each of the first color sub-pixel P1, the second color sub-pixel P2, and the third color sub-pixel P3 includes a pixel drive circuit and a light emitting device. The pixel drive circuit in each of the first color sub-pixel P1, the second color sub-pixel P2, and the third color sub-pixel P3 is connected with a scanning signal line, a data line, and a light emitting signal line. The pixel drive circuit is configured to receive a data voltage transmitted by the data line and output a corresponding current to the light emitting device under control of the scanning signal line and the light emitting signal line. The light emitting device in each of the first color sub-pixel P1, the second color sub-pixel P2, and the third color sub-pixel P3 is respectively connected with a pixel drive circuit of a sub-pixel where the light emitting device is located, and is configured to emit light with a corresponding brightness in response to a current output by the pixel drive circuit of the sub-pixel where the light emitting device is located.

In an exemplary embodiment, the pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited in the present disclosure. In an exemplary embodiment, a shape of the sub-pixel in the pixel unit may be a rectangle, a rhombus, a pentagon, or a hexagon. When the pixel unit includes three sub-pixels, the three sub-pixels may be arranged side by side horizontally, side by side vertically, or in a form of delta, and when the pixel unit includes four sub-pixels, the four sub-pixels may be arranged side by side horizontally, side by side vertically, or in a shape of a square, which is not limited in the present disclosure.

Figure 4:
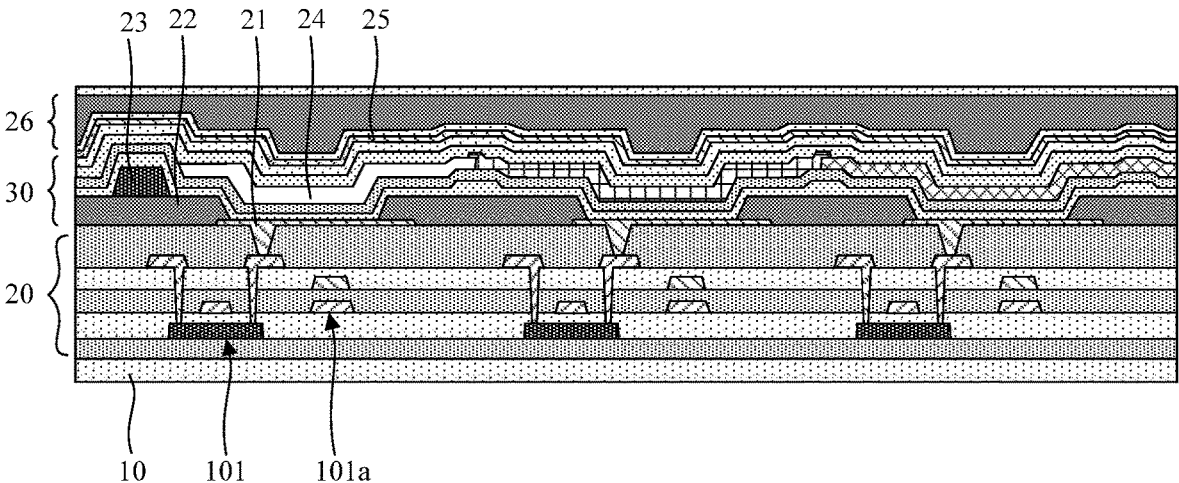
FIG. 4 is a schematic diagram of a pixel cross-sectional structure of a display region according to an exemplary embodiment of the present disclosure.

FIG. 4 is a schematic diagram of a pixel cross-sectional structure of a display region 100 according to an exemplary embodiment of the present disclosure, and illustrates a structure of three sub-pixels in a display substrate. As shown in FIG. 4, on a plane perpendicular to the display substrate, the display substrate may include a drive circuit layer 20 disposed on a base substrate 10, a light emitting structure layer 30 disposed on a side of the drive circuit layer 20 away from the base substrate 10, and an encapsulation layer 26 disposed on a side of the light emitting structure layer 30 away from the base substrate 10. In some possible embodiments, the display substrate may include another film layer, such as a Post Spacer, which is not limited in the present disclosure.

In an exemplary embodiment, the base substrate 10 may be a flexible base substrate or a rigid base substrate. A drive circuit layer 20 of each sub-pixel may include a plurality of transistors and a storage capacitor that form a pixel drive circuit. FIG. 4 shows only one transistor 101 and one storage capacitor 101a as an example. The light emitting structure layer 30 may include an anode 21, a Pixel Definition Layer 22, an organic light emitting layer 24, and a cathode 25, the anode 21 is connected with a drain electrode of the transistor through a via, the organic light emitting layer 24 is connected with the anode 21, the cathode 25 is connected with the organic light emitting layer 24, and the organic light emitting layer 24 emits light of a corresponding color under driving of the anode 21 and the cathode 25. The encapsulation layer 26 may include a first encapsulation layer, a second encapsulation layer, and a third encapsulation layer that are stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that external water vapor cannot enter the light emitting structure layer 30.

In an exemplary embodiment, the organic light emitting layer 24 may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) that are stacked. In an exemplary embodiment, hole injection layers of all sub-pixels may be connected together to form a common layer, electron injection layers of all the sub-pixels may be connected together to form a common layer, hole transport layers of all the sub-pixels may be connected together to form a common layer, electron transport layers of all the sub-pixels may be connected together to form a common layer, hole block layers of all the sub-pixels may be connected together to form a common layer, emitting layers of adjacent sub-pixels may be overlapped slightly or may be isolated from each other, and electron block layers of adjacent sub-pixels may be overlapped slightly or may be isolated from each other.

Figure 5A:
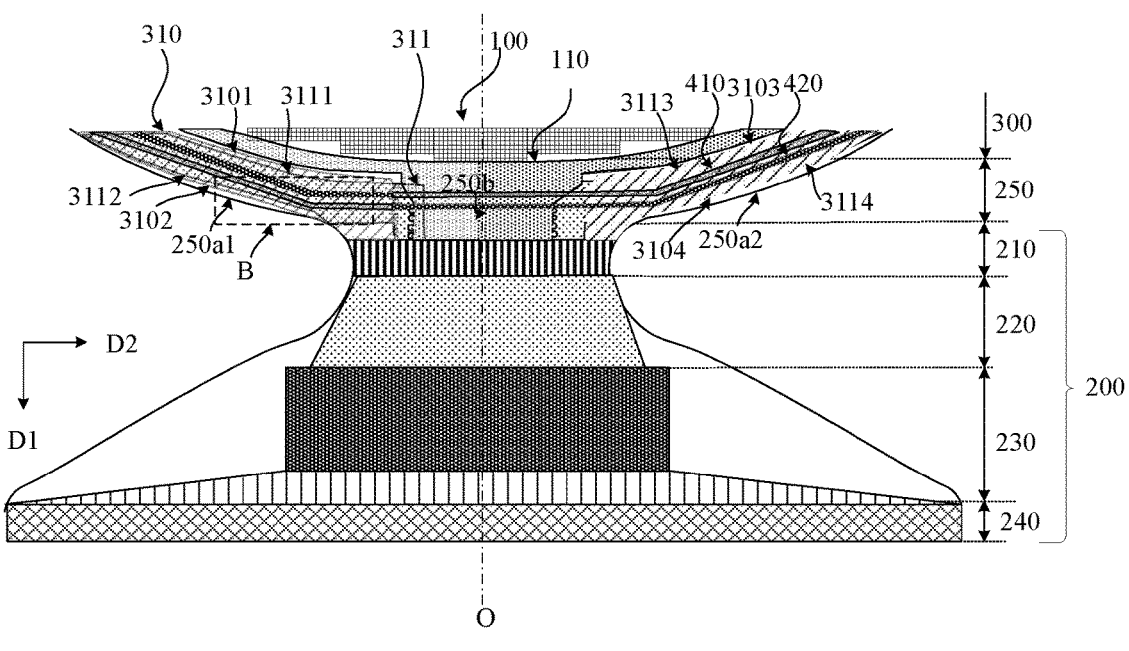
FIG. 5a is a schematic diagram of a second border region and a lead convergence region of a display substrate according to an exemplary embodiment of the present disclosure.
Figure 5B:
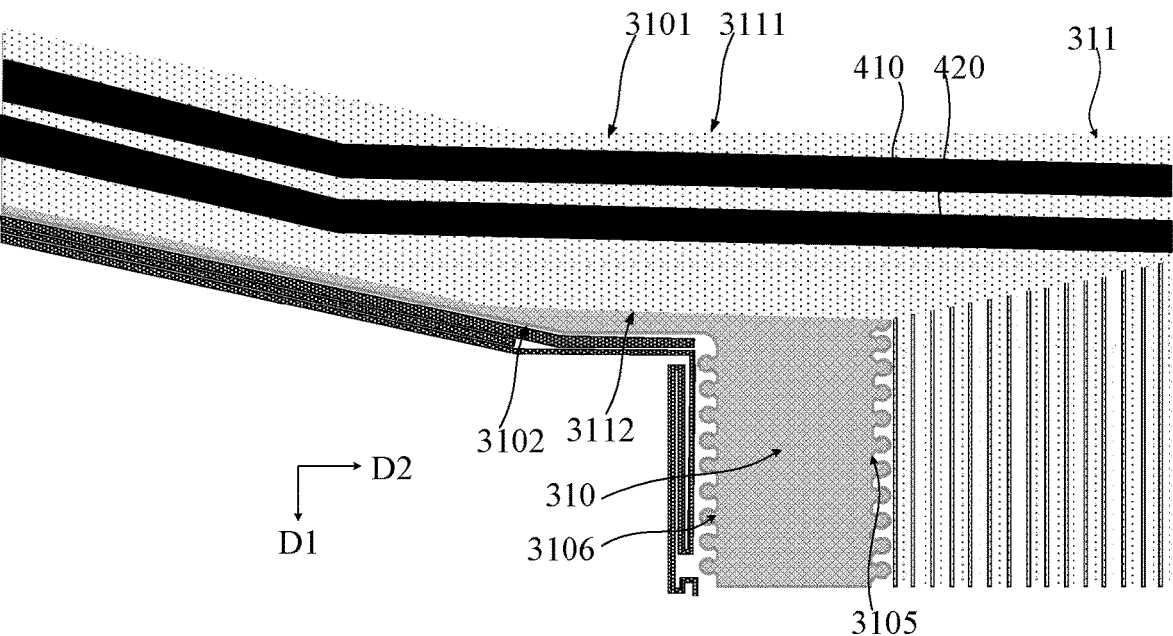

FIG. 5a is a schematic diagram of a structure of a second border region 200 and a lead convergence region 250 of a display substrate according to an exemplary embodiment of the present disclosure. FIG. 5b is a schematic diagram of an enlarged structure of a region B in FIG. 5a. As shown in FIGS. 5a and 5b, the second border region 200 and the lead convergence region 250 are disposed on a side of the display region 100 in a first direction D1, and the lead convergence region 250 is located between the first border region 300 and the second border region 200, and the lead convergence region 250 includes two corner regions 250a (i.e., a first corner region 250a1 and a second corner region 250a2) and an intermediate convergence region 250b located between the two corner regions 250a. The second border region 200 may include a bend region 210, a wiring region 220, a chip region 230, and a bonding region 240 that are disposed in sequence along the first direction D1 (i.e., a direction away from the display region 100). In an exemplary embodiment, the bending region 210 is configured to bend the second border region 200 to a back of the display substrate, the wiring region 220 is configured to lead out a data signal line, a power signal line, and a touch signal line, etc., to set positions, the chip region 230 is configured to bond an integrated circuit chip, and the bonding region 240 is configured to be provided with a plurality of bonding pins. The plurality of bonding pins may be bonded with a Flexible Printed Circuit (FPC for short) such that the data signal line, the power signal line, and the touch signal line are connected with an external control apparatus through the bonding pins and the bonded Flexible Printed Circuit. The external control apparatus provides a data signal, a power signal, and a touch signal for a display substrate so as to achieve image display and touch.

Figure 5C:
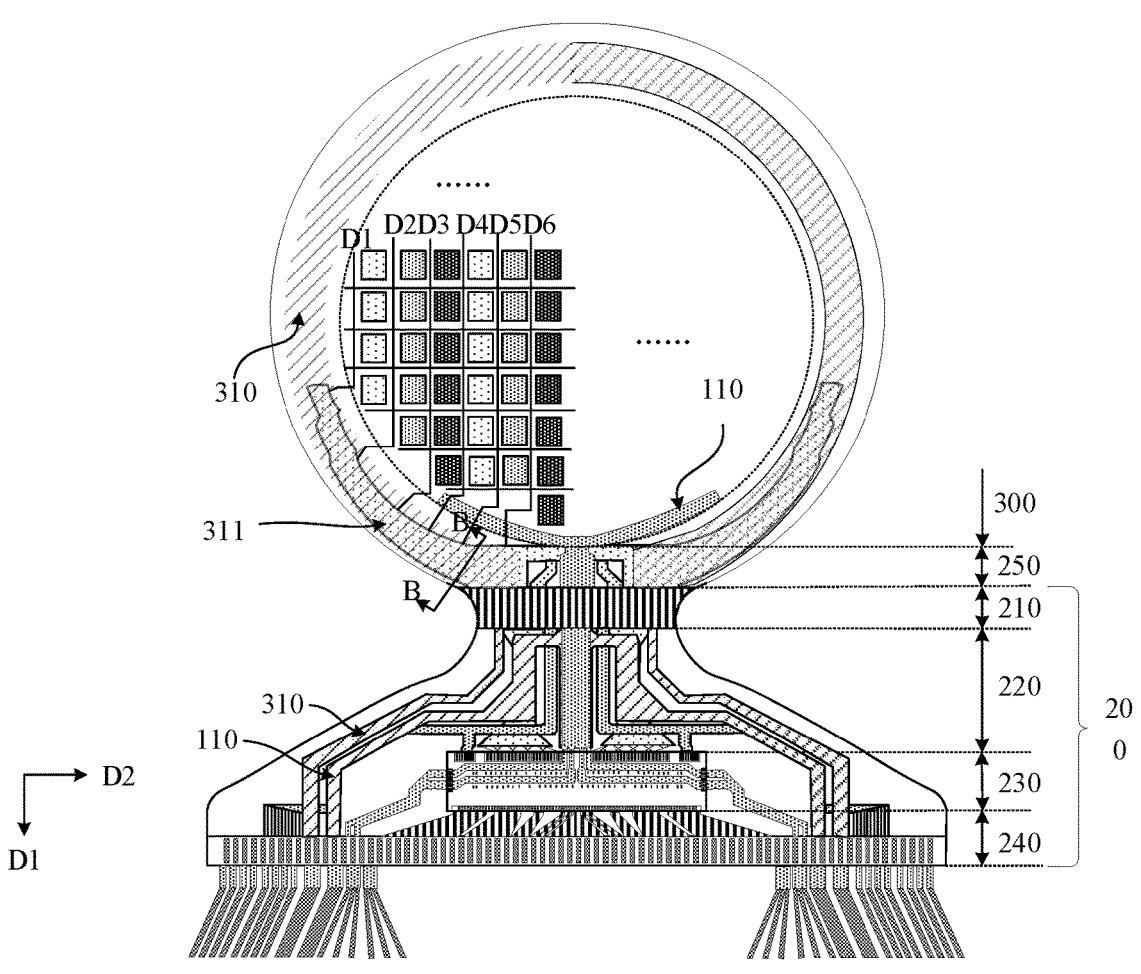
FIG. 5c is a schematic diagram of a structure of another display substrate according to an exemplary embodiment of the present disclosure.

In an exemplary embodiment, as shown in FIG. 5c, a plurality of test terminals (ET Pads) are also provided on a side of the second border region 200 away from the display region 100, the plurality of test terminals are correspondingly connected with the plurality of bonding pins of the bonding region 240 through interface lines, and are configured to test the display substrate to check whether pixels can be lit and whether there is a problem of a bright spot or a dark spot. In an exemplary embodiment, a connection line is provided between the second border region 200 and the plurality of test terminals and after a test is completed, a cutting apparatus cuts the connection line to remove the plurality of test terminals.

In an exemplary embodiment, a data signal line, a touch signal line, and a power signal line in the display substrate are first converged to the lead convergence region 250 and then extend from the lead convergence region 250 to the second border region 200. In the second border region 200, these signal lines first pass through the bending region 210, and then are led out to corresponding positions in the wiring region 220. Among them, the data signal line and the touch signal line are led to the chip region 230 and connected with pins of the chip region 230 correspondingly, the power signal line at least includes a first power supply line (VSS) 310 and a second power supply line (VDD) 110, the first power supply line 310 and the second power supply line 110 are led to the bonding region 240 and correspondingly connected with corresponding bonding pins. The second power supply line 110 and the first power supply line 310 are configured to connect a high voltage signal and a low voltage signal respectively.

In an exemplary embodiment, the second power supply line 110 and the first power supply line 310 may be disposed in a same layer, the second power supply line 110 and the first power supply line 310 may be disposed in different layers from the data signal line, and the touch signal line and the data signal line may be disposed in different layers. The second power supply line 110 and the first power supply line 310 may provide a shielding function for the data signal line and the touch signal line, thereby avoiding signal interference and improving reliability of signal transmission.

In some exemplary embodiments, the display substrate includes: a base substrate; a plurality of sub-pixels located in a display region 100; a plurality of data lines located in the display region 100 and electrically connected with the plurality of sub-pixels; a plurality of data line leads 311 located at least in a first border region 300 and a lead convergence region 250 and electrically connected with the plurality of data lines; a first power supply line 310 located in the first border region 300 and the lead convergence region 250, the first power supply line 310 at least partially surrounding the display region 100; and at least two first power supply pins located in a second border region, the at least two first power supply pins being connected with the first power supply line 310; wherein an orthographic projection of the first power supply line 310 on a plane of the base substrate of the first border region 300 and a corner region 250a is at least partially overlapped with an orthographic projection of the plurality of data line leads 311 on the plane of the base substrate.

According to the exemplary embodiment of the present disclosure, the orthographic projection of the first power supply line 310 on the plane of the base substrate of the first border region 300 and the corner region 250a is at least partially overlapped with the orthographic projection of the plurality of data line leads 311 on the plane of the base substrate; on one hand, stress resistance of the corner region 250a is improved; on the other hand, the first power supply line 310 may effectively prevent inward expansion of microcracks, thereby ensuring that microcracks generated during cutting do not affect a function of a circuit unit in a circuit region, and improving display quality of a display panel. The preparation process of the display substrate in the exemplary embodiment of the present disclosure has good process compatibility, simple process achievement, easy implementation, high production efficiency, low production cost and high yield rate.

In some exemplary embodiments, an orthographic projection of the first power supply line 310 on the plane of the base substrate of the first border region 300 includes an orthographic projection of the plurality of data line leads 311 on the plane of the base substrate of the first border region 300.

In some exemplary embodiments, the first power supply line 310 includes a first boundary 3101 close to the display region 100 and a second boundary 3102 away from the display region 100 in the first border region 300 and a first corner region 250a1, the plurality of data line leads 311 include a first data line lead group located in the first border region 300 and the first corner region 250a1, and the first data line lead group includes a third boundary 3111 close to the display region 100 and a fourth boundary 3112 away from the display region 100.

In some exemplary embodiments, at least a portion of the third boundary 3111 is located on a side of the first boundary 3101 close to the display region 100, and a shortest distance between the first boundary 3101 and the third boundary 3111 is between 5 microns and 10 microns.

In some exemplary embodiments, a width of the first power supply line is between 200 and 350 microns.

In some exemplary embodiments, at least a portion of the first boundary 3101 is located on a side of the third boundary 3111 close to the display region 100, and a shortest distance between the first boundary 3101 and the third boundary 3111 is between 2 microns and 5 microns.

In some exemplary embodiments the fourth boundary 3112 is located on a side of the second boundary 3102 close to the display region 100.

In some exemplary embodiments, a shortest distance between the second boundary 3102 and the fourth boundary 3112 is between 10 microns and 25 microns.

In some exemplary embodiments, a ratio of a width of the first power supply line 310 to a maximum width of the plurality of data line leads 311 ranges from 1.1 to 1.2.

In some exemplary embodiments, the first boundary 3101 is located on a side of the third boundary 3111 close to the display region 100 and the second boundary 3102 is located on a side of the fourth boundary 3112 away from the display region 100.

In some exemplary embodiments, the first power supply line 310 further includes a fifth boundary 3103 close to the display region 100 and a sixth boundary 3104 away from the display region in the first border region 300 and a second corner region 250a2.

The plurality of data line leads 311 further include a second data line group located in the first border region 300 and the second corner region 250a2, and the second data line lead group includes a seventh boundary 3113 close to the display region 100 and an eighth boundary 3114 away from the display region.

In some exemplary embodiments, the display region 100 includes a center line O that is a straight line extending along a first direction D1 and dividing the display region 100 equally, and the second data line group and the first data line group are disposed symmetrically with respect to the center line O.

In some exemplary embodiments, at least a portion of the seventh boundary 3113 is located on a side of the fifth boundary 3103 close to the display region 100, and a shortest distance between the seventh boundary 3113 and the fifth boundary 3103 is between 5 microns and 10 microns.

In some exemplary embodiments, at least a portion of the fifth boundary 3103 is located on a side of the seventh boundary 3113 close to the display region 100, and a shortest distance between the fifth boundary 3103 and the seventh boundary 3113 is between 2 microns and 5 microns.

In some exemplary embodiments, the eighth boundary 3114 is located on a side of the sixth boundary 3104 close to the display region 100.

In some exemplary embodiments, a shortest distance between the sixth boundary 3104 and the eighth boundary 3114 is between 10 microns and 25 microns.

In some exemplary embodiments, the fifth boundary 3103 is located on a side of the seventh boundary 3113 close to the display region and the sixth boundary 3104 is located on a side of the eighth boundary 3114 away from the display region.

Figure 6A:
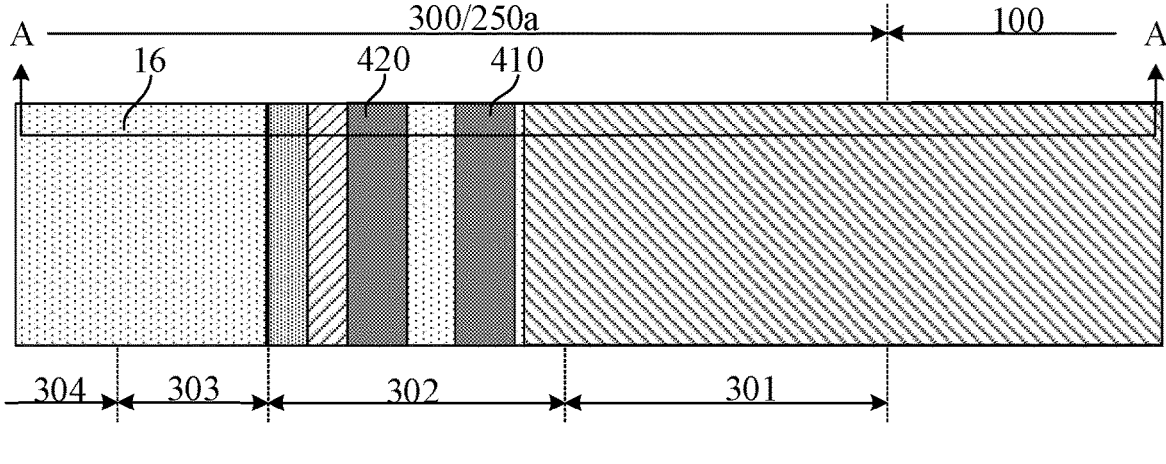
FIG. 6a is a schematic diagram of an enlarged structure of a region A in FIG. 2.
Figure 6B:
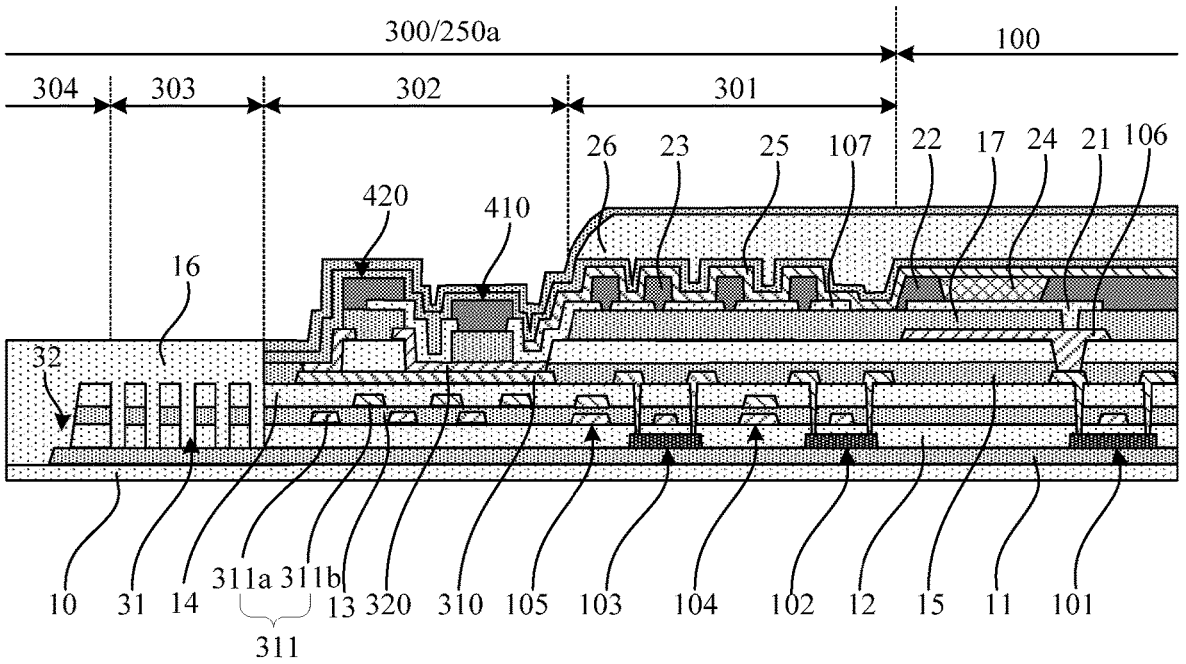
FIG. 6b is a schematic diagram of a cross-sectional structure taken along a direction A-A in FIG. 6a or along a direction B-B in FIG. 5c.

In some exemplary embodiments, as shown in FIGS. 6a and 6b, in a direction away from the display region 100, each of the corner region 250a (including the first corner region 250a1 and the second corner region 250a2) and the first border region 300 includes a circuit region 301, a isolating dam region 302, a crack dam region 303, and a cutting region 304 in sequence. The circuit region 301 includes a plurality of circuit units configured to provide drive signals or test signals to a plurality of sub-pixels. A first power supply line 310 and a plurality of data line leads 311 are disposed in the isolating dam region 302 which further includes an isolating dam disposed on the first power supply line 310. The crack dam region 303 includes a crack dam, and the cutting region 304 includes a cutting groove.

In some exemplary embodiments, an isolating dam includes a first isolating dam 410 and a second isolating dam 420. The first isolating dam 410 and the second isolating dam 420 surround the display region 100. A distance between the first isolating dam 410 and an edge of the display region 100 is less than a distance between the second isolating dam 420 and an edge of the display region 100, and orthographic projections of the first isolating dam 410 and the second isolating dam 420 on the plane of the base substrate are at least partially within a range of an orthographic projection of the first power supply line 310 on the plane of the base substrate.

In the first border region 300, the orthographic projections of the first isolating dam 410 and the second isolating dam 420 on the plane of the base substrate are within the range of the orthographic projection of the first power supply line 310 on the plane of the base substrate. In the lead convergence region 250, the orthographic projections of the first isolating dam 410 and the second isolating dam 420 on the plane of the base substrate are overlapped with the orthographic projection of the first power supply line 310 on the plane of the base substrate.

In some exemplary embodiments, in a plane perpendicular to a display substrate, the display substrate includes a base substrate, and a drive circuit layer 20, a light emitting structure layer 30, and an encapsulation layer 26 that are stacked on the base substrate. The drive circuit layer 20 includes an active layer, a first gate metal layer, a second gate metal layer, a first source drain metal layer, and a second source drain metal layer that are stacked on the base substrate. The light emitting structure layer 30 includes an anode 21, a cathode 25, and an organic light emitting layer 24 disposed between the anode 21 and the cathode 25.

A plurality of data line leads 311 are disposed in a same layer as one or more of the first gate metal layer and the second gate metal layer, and a first power supply line 310 is disposed in a same layer as at least one of the first source drain metal layer, the second source drain metal layer, and the anode 21.

According to the present disclosure, through the first source drain metal layer, the second source drain metal layer, and the anode, a multi-layer power supply wiring in a parallel structure is achieved, a resistance of a power supply wiring is reduced, a voltage drop of a voltage signal is minimized to a maximum extent, and uniformity of display brightness in the display region is improved, and display quality is improved.

In some exemplary embodiments, the plurality of data line leads 311 include a first data line lead 311a and a second data line lead 311b disposed alternately along a direction away from the display region 100. The first data line lead 311a is disposed in a same layer as the first gate metal layer, and the second data line lead 311b is disposed in a same layer as the second gate metal layer, and an orthographic projection of the first data line lead 311a on the plane of the base substrate is not overlapped with an orthographic projection of the second data line lead 311b on the plane of the base substrate.

In some exemplary embodiments, as shown in FIG. 5b, the first border region 300 further includes a crack detection line 312 extending from the first border region 300 to the corner region 250a, the crack detection line 312 is located on a side of the first power supply line 310 away from the display region 100, and an orthographic projection of the crack detection line 312 on the plane of the base substrate is not overlapped with an orthographic projection of the first power supply line 310 on the plane of the base substrate.

In some exemplary embodiments, as shown in FIG. 5b, the first power supply line 310 includes a ninth boundary 3105 and a tenth boundary 3106 extending along a first direction D1, the ninth boundary 3105 and the tenth boundary 3106 are disposed opposite to each other along a second direction D2, the ninth boundary 3105 is located in the lead convergence region 250 and the second border region 200, the tenth boundary 3106 is located in the second border region 200, and both the ninth boundary 3105 and the tenth boundary 3106 are at least partially non-linear.

In some exemplary embodiments, as shown in FIGS. 5a and 5c, the display substrate further includes a second power supply line 110 located in the lead convergence region 250 and the second border region 200, and an orthographic projection of the second power supply line 110 on the plane of the base substrate of the lead convergence region 250 is overlapped at least partially with an orthographic projection of the plurality of data line leads 311 on the plane of the base substrate.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" which has experienced the patterning process includes at least one "pattern". "A and B being disposed in a same layer" in the present disclosure means that A and B are formed simultaneously through a same patterning process, but A and B are not necessarily located on a same level, and a "thickness" of a film layer is a dimension of the film layer in a direction perpendicular to the display substrate. In an exemplary embodiment of the present disclosure, "an orthographic projection of B is within a range of an orthographic projection of A" refers to a boundary of the orthographic projection of B falling within a boundary range of the orthographic projection of A, or a boundary of the orthographic projection of A is overlapped with a boundary of the orthographic projection of B.

In an exemplary embodiment, the display substrate includes a display region 100 and a non-display region surrounding the display region 100. The non-display region includes a first border region 300 at least partially surrounding the display region 100, a second border region 200 located on a side of the display region 100, and a lead convergence region 250. The lead convergence region 250 is located between the first border region 300 and the second border region 200. The lead convergence region 250 includes two corner regions 250a (a first corner region 250a1 and a second corner region 250a2) and an intermediate convergence region 250b located between the two corner regions 250a. Each of the first border region 300 and the corner regions 250a includes a circuit region 301, an isolating dam region 302, a crack dam region 303, and a cutting region 304 that are sequentially disposed along a direction away from the display region 100. The preparation process of the display substrate may include following operations.

(1) A base substrate 10 is prepared on a glass carrier plate 1. In some exemplary embodiments, the base substrate 10 may include a first flexible material layer, a first inorganic material layer, a semiconductor layer, a second flexible material layer, and a second inorganic material layer that are stacked on the glass carrier plate 1. Materials of the first and second flexible material layers may be Polyimide (PI), Polyethylene terephthalate (PET), a polymer soft film subjected to a surface treatment, or the like. Materials of the first and second inorganic material layers may be Silicon Nitride (SiNx), Silicon Oxide (SiOx), or the like, so as to improve a water-oxygen resistance capability of the base substrate. The first and second inorganic material layers are also referred to as barrier layers. A material of the semiconductor layer may be amorphous silicon (a-si). In some exemplary embodiments, taking a laminated structure of PI1/Barrier1/a-si/PI2/Barrier2 as an example, its preparation process includes: firstly, coating a layer of polyimide on the glass carrier plate 1, curing it into a film to form a first flexible (PI1) layer; then, depositing a layer of barrier thin film on the first flexible layer to form a first barrier layer (Barrier1) covering the first flexible layer; then depositing a layer of amorphous silicon thin film on the first barrier layer to form an amorphous silicon (a-si) layer covering the first barrier layer; then coating a layer of polyimide on the amorphous silicon layer, curing it into a film to form a second flexible (PI2) layer; then, depositing a layer of barrier thin film on the second flexible layer to form a second barrier (Barrier2) layer covering the second flexible layer, thereby completing preparation of the base substrate 10. After this process, a display region 100, a first border region 300, and a corner region 250a all include the base substrate 10.

(2) Patterns of a drive structure layer and a circuit structure layer are prepared on the base substrate 10. A drive structure layer of the display region 100 includes a first transistor 101 used to form a pixel drive circuit, and a circuit structure layer of the first border region 300 and the corner regions 250a includes a second transistor 102, a third transistor 103, a first storage capacitor 104, and a second storage capacitor 105 forming a Gate Driver on Array (GOA) circuit, and also includes a first power supply line 310. In an exemplary embodiment, a preparation process of the drive structure layer and the circuit structure layer may include: sequentially depositing a first insulation thin film and a semiconductor thin film on the base substrate 10, and patterning the semiconductor thin film through a patterning process to form a first insulation layer 11 covering the whole base substrate 10 and a pattern of a semiconductor layer disposed on the first insulation layer 11, wherein the pattern of the semiconductor layer at least includes a first active layer located in the display region 100, and a second active layer and a third active layer located in the circuit region 301.

Then, sequentially depositing a second insulation thin film and a first metal thin film, and patterning the first metal thin film through a patterning process to form a second insulation layer 12 covering the pattern of the semiconductor layer and a pattern of a first gate metal layer disposed on the second insulation layer 12, wherein the pattern of the first gate metal layer at least includes a first gate electrode located in the display region 100, a second gate electrode, a third gate electrode, a first capacitor electrode, and a second capacitor electrode located in the circuit region 301, and a first data line lead 311a located in a isolating dam region 302.

Then, sequentially depositing a third insulation thin film and a second metal thin film, patterning the second metal thin film through a patterning process to form a third insulation layer 13 covering the first gate metal layer, and a pattern of a second gate metal layer disposed on the third insulation layer 13, wherein the pattern of the second gate metal layer includes at least a third capacitor electrode and a fourth capacitor electrode located in the circuit region 301, and a second data line lead 311b located in the isolating dam region 302, a position of the third capacitor electrode corresponds to a position of the first capacitor electrode, a position of the fourth capacitor electrode corresponds to a position of the second capacitor electrode, and an orthographic projection of the first data line lead 311a on a plane of the base substrate is not overlapped with an orthographic projection of the second data line lead 311b on the plane of the base substrate.

Then, depositing a fourth insulation thin film and forming patterns of a plurality of first vias, a crack dam 31, and a cutting groove 32 through a patterning process; etching away the fourth insulation layer, the third insulation layer 13, and the second insulation layer 12 in two first vias in the display region 100 to expose both ends of the first active layer, wherein four first vias in the circuit region 301 respectively exposes both ends of the second active layer and the third active layer; the crack dam 31 is formed in a crack dam region 303, wherein the crack dam 31 includes a plurality of cracks disposed at intervals, each crack exposes a surface of the first insulation layer 11. The cutting groove 32 is formed in a cutting region 304, wherein the cutting groove 32 includes a first groove and a second groove, the first groove exposes the base substrate 10 and the second groove exposes the first groove, that is, an orthographic projection of the first groove on the base substrate 10 includes an orthographic projection of the second groove on the base substrate 10. After this patterning process, the isolating dam region 302 includes a composite insulation layer disposed on the base substrate 10, the crack dam region 303 includes a composite insulation layer with a plurality of cracks disposed on the base substrate 10, and the cutting region 304 includes a composite insulation layer with grooves disposed on the base substrate 10. In an exemplary embodiment, the composite insulation layer includes the first insulation layer 11, the second insulation layer 12, the third insulation layer 13, and the fourth insulation layer 14 that are stacked on the base substrate 10.

In an exemplary embodiment, the cracks, the first groove, and the second groove may be formed using two patterning processes. For example, etching away the fourth insulation layer 14, the third insulation layer 13, and the second insulation layer 12 through a first mask (Etch Bending A MASK, EBA MASK for short), forming the second groove in the cutting region 304, forming the plurality of cracks in the crack dam region 303, forming the plurality of first vias in the circuit region 301 and the display region 100, etching away the fourth insulation layer 14, the third insulation layer 13, and the second insulation layer 12 in the second groove and the plurality of cracks to expose a surface of the first insulation layer 11, and etching away the fourth insulation layer 14, the third insulation layer 13, and the second insulation layer 12 in the plurality of first vias to respectively expose both ends of the first active layer, the second active layer, and the third active layer. Then, etching away the first insulation layer 11 in the second groove in the cutting region 304 through a second mask (Etch Bending B MASK, EBB MASK for short), forming the first groove on the first insulation layer 11, and etching away the first insulation layer in the first groove to expose a surface of the base substrate 10. In this way, in the cutting region 304, the second groove exposes the first groove, and the first groove exposes the base substrate 10, and a stepped groove structure is formed. In the crack dam region 303, the plurality of cracks disposed at intervals expose the surface of the first insulation layer 11, and a crack dam structure in a concave-convex shape is formed. The EBA MASK and EBB MASK processes are patterning processes for trenching in a bending region of a bonding region to reduce a thickness of the bending region. In an exemplary embodiment, forming the crack dam structure in the concave-convex shape in the crack dam region 303 is to avoid affecting film layer structures of the display region 100 and the circuit region 301 during a cutting process. The plurality of cracks disposed at intervals may not only reduce a stress on the display region 100 and the circuit region 301, but also can cut off transmission of cracks in a direction towards the display region 100 and the circuit region 301. In an exemplary embodiment, part of a thickness of a second barrier layer in the base substrate 10 may be etched away in the first groove.

Then, a third metal thin film is deposited, the third metal thin film is patterned through a patterning process, and a pattern of a first source drain metal layer is formed on the fourth insulation layer 14, wherein the pattern of the first source drain metal layer at least includes: a first source electrode and a first drain electrode formed in the display region 100, a second source electrode, a second drain electrode, a third source electrode, and a third drain electrode formed in the circuit region 301, and a first power supply line 310 formed in the isolating dam region 302. The first source electrode and the first drain electrode are respectively connected with the first active layer through the first vias, the second source electrode and the second drain electrode are respectively connected with the second active layer through the first vias, and the third source electrode and the third drain electrode are respectively connected with the third active layer through the first vias. The first power supply line 310 formed in the isolating dam region 302 is disposed on the fourth insulation layer 14, and an end of the first power supply line 310 away from the display region 100 is spaced from the crack dam 31.

Figure 7A:
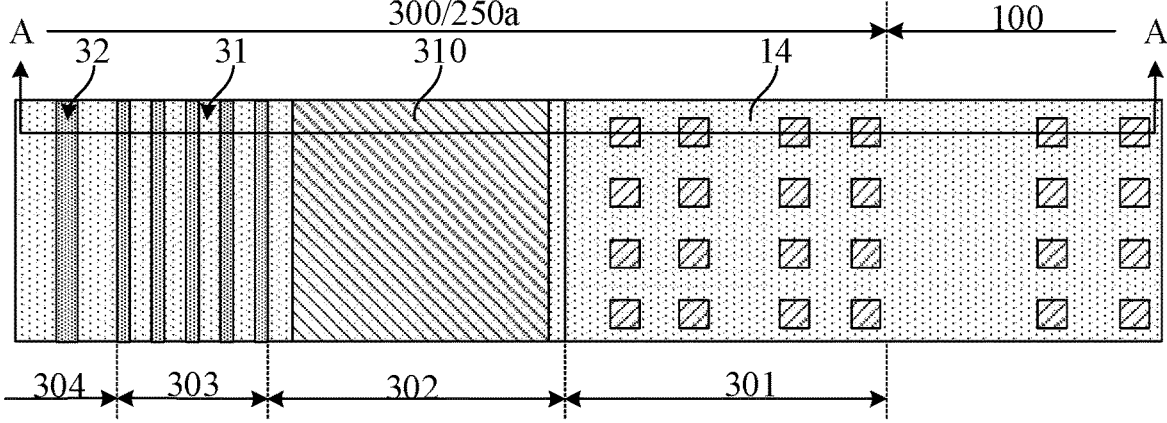
FIG. 7a is a schematic diagram of a display substrate after patterns of a drive structure layer and a circuit structure layer are formed according to the present disclosure.
Figure 7B:
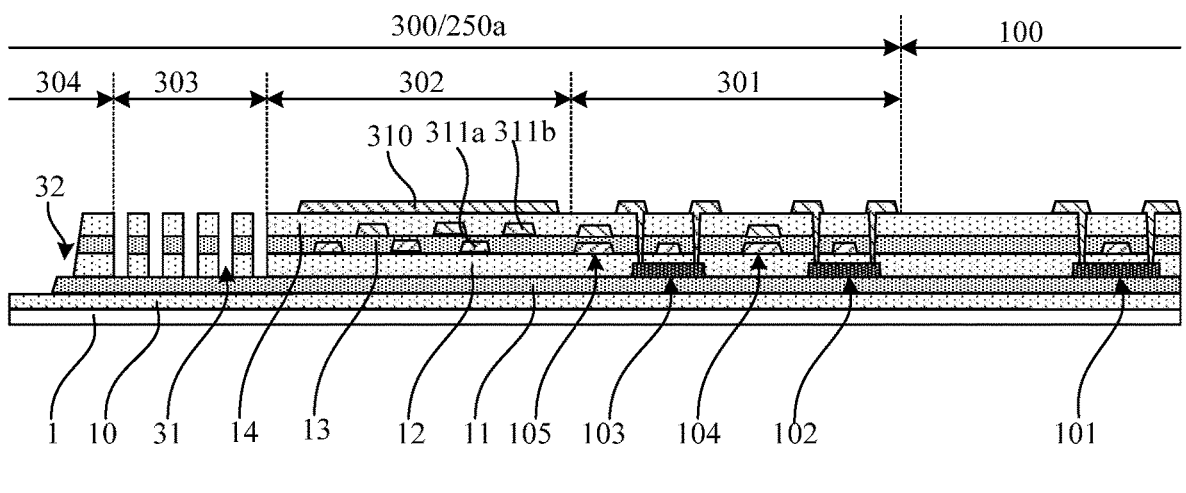

So far, preparation of the patterns of the drive structure layer and the circuit structure layer on the base substrate 10 is completed, as shown in FIGS. 7*a* and 7*b*, and FIG. 7*b* is a cross-sectional view taken along a direction A-A in FIG. 7*a*. In an exemplary embodiment, the first active layer, the first gate electrode, the first source electrode, and the first drain electrode form a first transistor 101, the second active layer, the second gate electrode, the second source electrode, and the second drain electrode form a second transistor 102, the third active layer, the third gate electrode, the third source electrode, and the third drain electrode form a third transistor 103, the first capacitor electrode and the third capacitor electrode form a first storage capacitor 104, and the second capacitor electrode and the fourth capacitor electrode form a second storage capacitor 105. In an exemplary embodiment, the first transistor 101 may be a drive transistor in a pixel drive circuit, the second transistor 102 may be a scan transistor for outputting a scanning (SCAN) signal in a GOA circuit, the third transistor 103 may be an enabling transistor for outputting an enabling (EM) signal in a GOA circuit, wherein the drive transistor, the scan transistor, and the enabling transistor may all be Thin Film Transistors (TFTs for short).

Figure 8A:
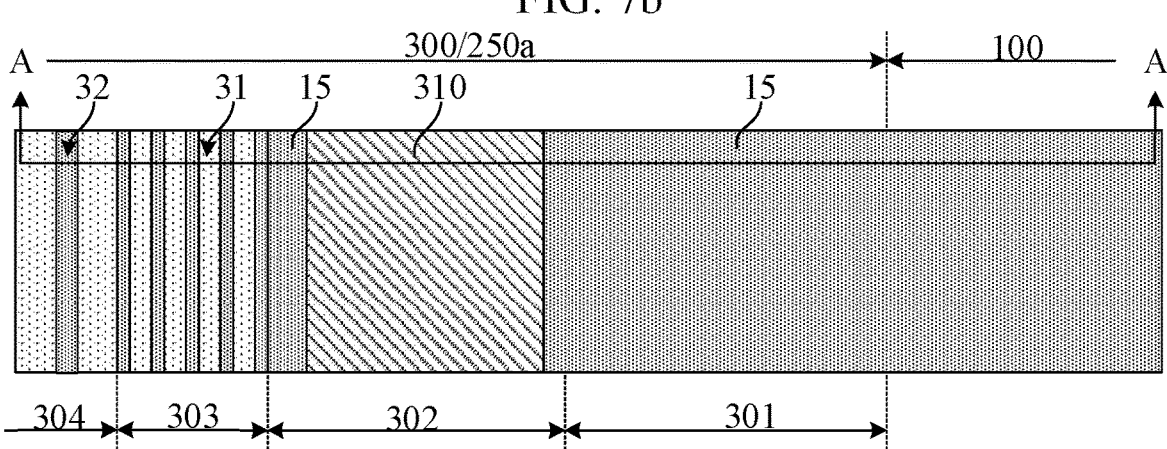
FIG. 8a is a schematic diagram of a display substrate after a pattern of a fifth insulation layer is formed according to the present disclosure.
Figure 8B:
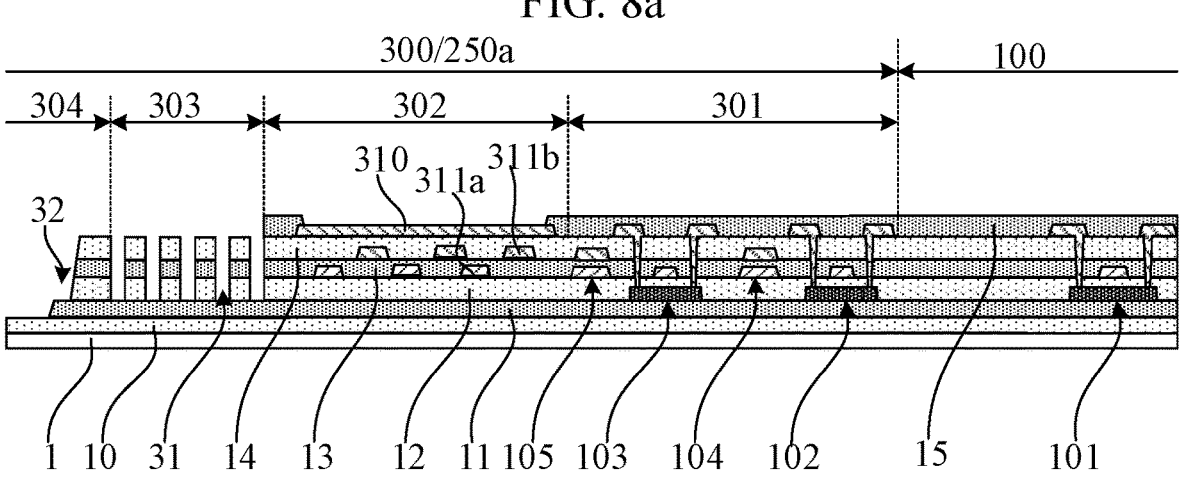

(3) A fifth insulation thin film is deposited on the base substrate where the above-mentioned patterns are formed, and the fifth insulation thin film is patterned through a patterning process, a pattern of a fifth insulation layer 15 is formed in the display region 100, the circuit region 301, and the isolating dam region 302, and the fifth insulation thin film in the crack dam region 303 and the cutting region 304 is removed. The fifth insulation layer 15 in the display region 100 and the circuit region 301 covers source electrodes and drain electrodes of the first transistor 101, the second transistor 102, and the third transistor 103, and the fifth insulation layer 15 in the isolating dam region 302 only covers an edge of the first power supply line 310, that is, a first edge of the first power supply line 310 adjacent to the display region 100 and a second edge of the first power supply line 310 away from the display region 100 are covered by the fifth insulation layer 15, and the fifth insulation layer 15 between the first edge and the second edge is removed to expose a surface of the first power supply line 310, as shown in FIG. 8*a* and FIG. 8*b*, and FIG. 8*b* is a cross-sectional view taken along a direction A-A in FIG. 8*a*.

(4) A first planarization thin film is coated on the base substrate where the above-mentioned patterns are formed, the first planarization film is patterned through a patterning process, a first planarization (PLN) layer 16 is formed on the display region 100, the circuit region 301, the crack dam region 303, and the cutting region 304, and patterns of a second via, a partition, and a planarization dam foundation are formed on the first planarization layer 16. The second via is formed in the display region 100, and the first planarization layer 16 and the fifth insulation layer 15 in the second via are removed to expose a surface of the first drain electrode of the first transistor 101. The partition is formed in the isolating dam region 302, and the first planarization layer 16 in the partition is removed to expose a surface of the first power supply line 310. A first dam foundation 401 is formed on the first power supply line 310 in the partition. The first planarization layer 16 formed in the crack dam region 303 completely fills cracks in the crack dam 31, and the first planarization layer 16 formed in the cutting region 304 completely fills a groove 32, as shown in FIGS. 9*a* and 9*b*, and FIG. 9*b* is a cross-sectional view taken along a direction A-A in FIG. 9*a*. In an exemplary embodiment, a first length of the first dam foundation 401 may be about 20 μm to 60 μm, and the first dam foundation 401 is configured to form a second isolating dam. In the present disclosure, "a first length" refers to a feature size along a direction away from the display region.

Figure 10B:
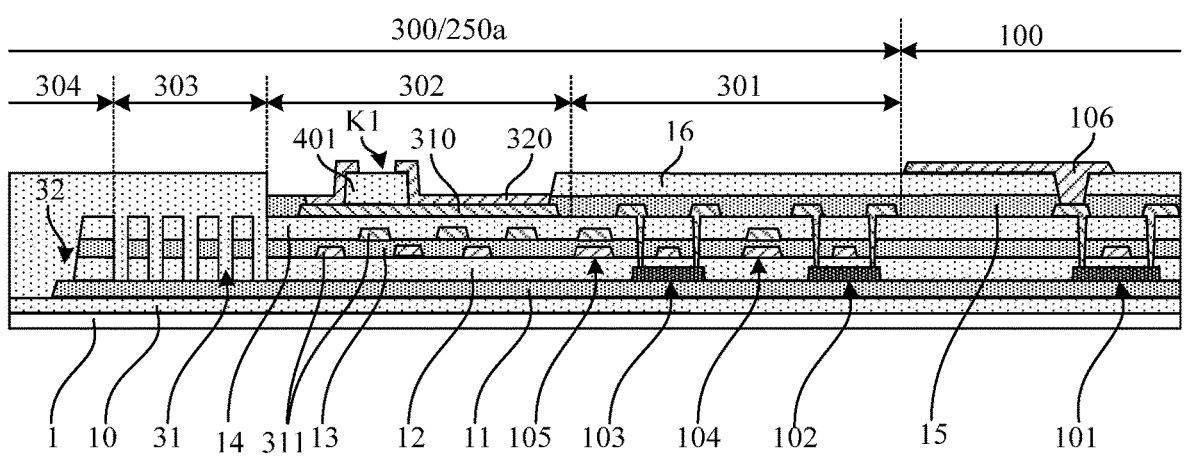

(5) A fourth metal thin film is deposited on the base substrate where the above-mentioned patterns are formed, and the fourth metal thin film is patterned through a patterning process to form a pattern of a second source drain metal layer, wherein the pattern of the second source drain metal layer at least includes a connection electrode 106 and an auxiliary power supply line 320. The first connection electrode 106 is formed in the display region 100 and connected with the first drain electrode of the first transistor 101 through the second via. The auxiliary power supply line 320 is formed in the isolating dam region 302, the auxiliary power supply line 320 covers a surface of the first dam foundation 401, a first side of the auxiliary power supply line 320 adjacent to the display region 100 and a second side of the auxiliary power supply line 320 away from the display region 100 are both overlapped on the first power supply line 310, that is, the auxiliary power supply line 320 is disposed on the first power supply line 310 exposed on both sides of the first dam foundation 401 to achieve a connection between the first power supply line 310 and the auxiliary power supply line 320, and the auxiliary power supply line 320 is provided with a first deflation structure K1, as shown in FIGS. 10*a* and 10*b*, and FIG. 10*b* is a cross-sectional view taken along a direction A-A in FIG. 10*a*. In an exemplary embodiment, the first dam foundation 401 includes a first surface (an upper surface) on a side away from the first power supply line 310, a first near side (a right side surface) on a side adjacent to the display region 100, and a first distal side (a left side surface) on a side away from the display region 100. The first deflation structure K1 is disposed on the auxiliary power supply line 320 covering a first surface of the first dam foundation 401, and an orthographic projection of the first deflation structure K1 on the base substrate is located within a range of an orthographic projection of the first surface on the base substrate. In an exemplary embodiment, the first deflation structure K1 may be at least one first through hole, and the auxiliary power supply line 320 in the at least one first through hole is removed to expose the first surface of the first dam foundation 401. In this way, the first power supply line 310 of the first source drain metal layer and the auxiliary power supply line 320 of the second source drain metal layer form a double-layer power supply line in the first border region 300. By overlapping in the isolating dam region 302, a double-layer power supply wiring with a parallel structure is achieved, which reduces a resistance of a power supply wiring in an edge region, minimizes voltage drop of a voltage signal to a maximum extent, improves uniformity of display brightness of the display region, and improves display quality. In an exemplary embodiment, a plurality of first through holes may be disposed at intervals along an edge direction of the display region, and in a plane parallel to the display substrate, a shape of the first through hole may be a triangle, a rectangle, a polygon, a circle, an ellipse, etc. In an exemplary embodiment, a shape of the first through hole may be a rectangular, a first length of the rectangle may be about 10 μm to 40 μm, a second length of the rectangle may be about 10 μm to 40 μm, and a distance between adjacent first through holes may be about 10 μm to 40 μm. In the present disclosure, "a second length" refers to a feature size along an edge direction of the display region.

In an exemplary embodiment, in a plane perpendicular to the display substrate, a cross-sectional shape of the first dam foundation 401 may be a trapezoid, and a first length of an upper bottom (a first surface) on a side away from the substrate may be smaller than a first length of a lower bottom on a side adjacent to the substrate.

In an exemplary embodiment, the first deflation structure K1 disposed on the auxiliary power supply line 320 is configured to form a deflation channel, and discharge a gas generated by a planarizing film layer during a process, thereby avoiding peeling of a film layer and improving process quality. In an exemplary embodiment, a thickness of the second source drain metal layer may be about 700 nm to 1000 nm. In some possible embodiments, the thickness of the second source drain metal layer may be about 860 nm.

Figure 11A:
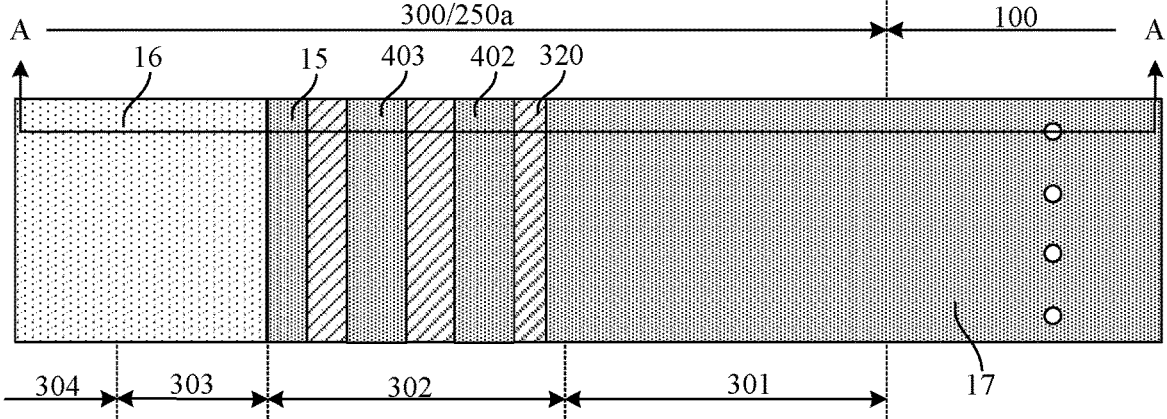
FIG. 11a is a schematic diagram of a display substrate after a pattern of a second planarization layer is formed according to the present disclosure.
Figure 11B:
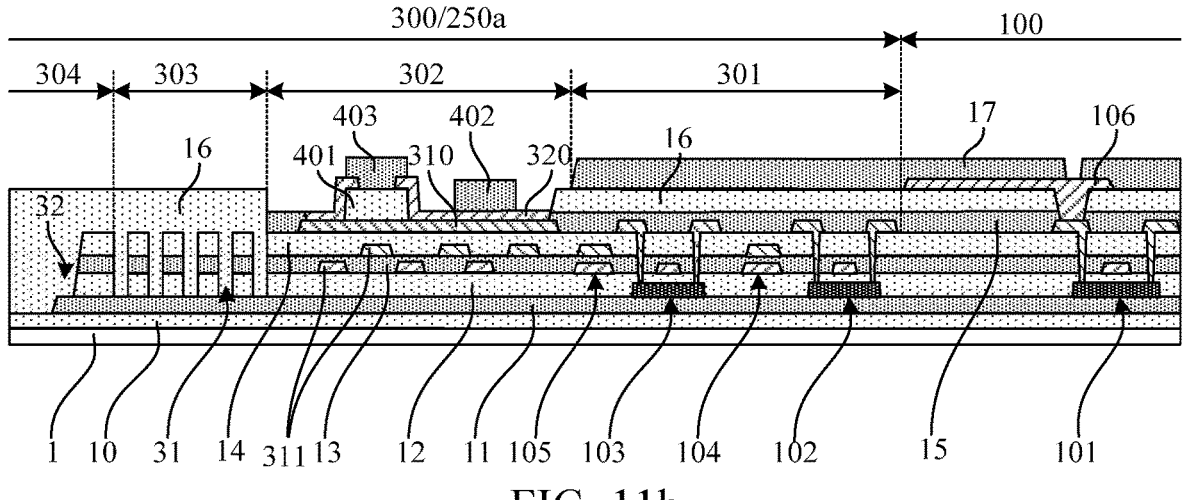

(6) A second planarization thin film is coated on the base substrate where the above-mentioned patterns are formed, and the second planarization thin film is patterned through a patterning process to form patterns of a second planarization layer 17, a second dam foundation 402, and a third dam foundation 403. The second planarization layer 17 is formed in the display region 100 and the circuit region 301, on which a third via is disposed, and the second planarization layer 17 in the third via is developed to expose a surface of the first connection electrode 106. The second dam foundation 402 and the third dam foundation 403 are formed in the isolating dam region 302, the third dam foundation 403 is disposed on the auxiliary power supply line 320 covering the first surface of the first dam foundation 401, the second dam foundation 402 is disposed on the auxiliary power supply line 320 on a side of the first dam foundation 401 adjacent to the display region 100, a distance between the second dam foundation 402 and the display region 100 is smaller than a distance between the first dam foundation 401 and the display region 100, and both a side of the second dam foundation 402 adjacent to the third dam foundation 403 and a side of the second dam foundation 402 away from the third dam foundation 403 expose the auxiliary power supply line 320, as shown in FIGS. 11a and 11b, and FIG. 11b is a cross-sectional view taken along a direction A-A in FIG. 11a. In an exemplary embodiment, an orthographic projection of the first dam foundation 401 on the base substrate includes an orthographic projection of the third dam foundation 403 on the base substrate, and the second dam foundation 402 and the third dam foundation 403 are configured to form two isolating dams (dams).

(7) A transparent conductive thin film is deposited on the base substrate where the above-mentioned patterns are formed, and the transparent conductive thin film is patterned through a patterning process to form patterns of an anode 21 and a second connection electrode 107. The anode 21 is disposed on the second planarization layer 17 of the display region 100, and the anode 21 is connected with the first connection electrode 106 through the third via. The second connection Electrode 107 is formed in the circuit region 301 and the isolating dam region 302, one part of the second connection electrode 107 is disposed on the second planarization layer 17 of the circuit region 301, a plurality of fourth vias are disposed thereon, the other part of the second connection electrode 107 is disposed in the isolating dam region 302, the second connection electrode 107 covers the second dam foundation 402, partially covers the third dam foundation 403, and covers a surface of the auxiliary power supply line 320 exposed on both sides of the second dam foundation 402, the second connection electrode 107 is provided with a second deflation structure K2, as shown in FIGS. 12a and 12b, and FIG. 12b is a cross-sectional view taken along a direction A-A in FIG. 12a. In an exemplary embodiment, the second deflation structure K2 is disposed on the second connection electrode 107 covering a second surface of the second dam foundation 402, and an orthographic projection of the second deflation structure K2 on the base substrate is within a range of an orthographic projection of the second surface on the base substrate. In an exemplary embodiment, the second deflation structure K2 may be at least one second through hole, and the second connection electrode 107 in the at least one second through hole is removed to expose the second surface of the second dam foundation 402. Because the second connection electrode 107 is connected with the auxiliary power supply line 320 and the auxiliary power supply line 320 is connected with the first power supply line 310, a connection between the second connection electrode 107 and the first power supply line 310 is achieved. In an exemplary embodiment, a plurality of second through holes may be disposed at intervals along an edge direction of the display region, and in a plane parallel to the display substrate, a shape of a second through hole may be a triangle, a rectangle, a polygon, a circle, or an ellipse, etc.

In an exemplary embodiment, in a plane perpendicular to the display substrate, a cross-sectional shape of the second dam foundation 402 may be a trapezoid, and a first length of an upper bottom (a second surface) on a side away from the substrate may be smaller than a first length of a lower bottom on a side adjacent to the substrate.

In an exemplary embodiment, the second deflation structure K2 disposed on the second connection electrode 107 is configured to form a deflation channel, which discharges gases generated by a planarization film layer during the process, thereby avoiding peeling of a film layer and improving the process quality.

(8) A pixel definition thin film is coated on the base substrate where the above-mentioned patterns are formed, and the pixel definition thin film is patterned through a patterning process to form patterns of a Pixel Definition Layer (PDL) 22, a Post Spacer (PS) 23, a fourth dam foundation 404, and a fifth dam foundation 405. The Pixel Definition Layer 22 is formed in the display region 100, and a pixel opening is provided on it. The pixel definition thin film in the pixel opening is developed to expose a surface of the anode 21. A plurality of Post Spacers (PSs) 23 are formed in the circuit region 301, positions of the plurality of Post Spacers 23 correspond to positions of the plurality of fourth vias disposed on the second connection electrodes 107, and the second connection electrode 107 is exposed between adjacent Post Spacers 23. The fourth dam foundation 404 and the fifth dam foundation 405 are formed in the isolating dam region 302, the fourth dam foundation 404 is disposed on the second connection electrodes 107 covering the second surface of the second dam foundation 402, and the fifth dam foundation 405 is disposed on the third dam foundation 403; the second dam foundation 402, the second connection electrodes 107 covering the second surface, and the fourth dam foundation 404 form a first isolating dam 410; the first dam foundation 401, the auxiliary power supply lines 320 covering the first surface, the third dam foundation 403, and the fifth dam foundation 405 form a second isolating dam 420, as shown in FIGS. 13a and 13b, and FIG. 13b is a cross-sectional view taken along a direction A-A in FIG. 13a.

In an exemplary embodiment, a distance between the first isolating dam 410 and the display region 100 is less than a distance between the second isolating dam 420 and the display region 100, and an orthographic projection of the second dam foundation 402 on the base substrate includes an orthographic projection of the fourth dam foundation 404 on the base substrate, and an orthographic projection of the third dam foundation 403 on the base substrate includes an orthographic projection of the fifth dam foundation 405 on the base substrate. In an exemplary embodiment, in a plane perpendicular to the display substrate, cross-sectional shapes of the first isolating dam 410 and the second isolating dam 420 may be trapezoids.

(9) An organic light emitting layer 24 and a cathode 25 are sequentially formed on the base substrate where the above-mentioned patterns are formed, and the organic light emitting layer 24 is formed in a pixel opening of the display region 100 to achieve a connection between the organic light emitting layer 24 and the anode 21. Because the anode 21 is connected with the first connection electrode 106 and the first connection electrode 106 is connected with a drain electrode of the first transistor 101, a connection between the organic light emitting layer 24 and the drain electrode of the first transistor 101 is achieved. A part of the cathode 25 is formed on the organic light emitting layer 24 of the display region 100, and the cathode 25 is connected with the organic light emitting layer 24, and the other part of the cathode 25 is formed in the circuit region 301. The cathode 25 encloses the plurality of Post Spacers 23, and is connected with the second connection electrode 107 exposed between the plurality of Post Spacers 23, as shown in FIGS. 14a and 14b, and FIG. 14b is a cross-sectional view taken along a direction A-A in FIG. 14a. Because the cathode 25 is connected with the second connection electrode 107, the second connection electrode 107 is connected with the auxiliary power supply line 320, and the auxiliary power supply line 320 is connected with the first power supply line 310, thus a connection between the cathode 25 and the first power supply line 310 is achieved. In an exemplary embodiment, the organic light emitting layer 24 may include a hole injection layer, a hole transport layer, an emitting layer, an electron transport layer, and an electron injection layer which are stacked, and the cathode may be made of any one or more of magnesium (Mg), silver (Ag), aluminum (Al), copper (Cu), and lithium (Li), or an alloy made of any one or more of the above metals.

(10) An encapsulation layer 26 is formed on a basis of forming the above-mentioned patterns, and the encapsulation layer 26 is formed in the display region 100, the circuit region 301, and the isolating dam region 302. The encapsulation layer 26 of the display region 100 and the circuit region 301 has a laminated structure of a first encapsulation layer, a second encapsulation layer, and a third encapsulation layer. The first encapsulation layer is made of an inorganic material, covering the cathode 25 in the display region 100, enclosing the plurality of Post Spacers 23 in the circuit region 301, and enclosing the first isolating dam 410 and the second isolating dam 420 in the isolating dam region 302. The second encapsulation layer is made of an organic material, and is disposed in the display region 100 and the circuit region 301. The third encapsulation layer is made of an inorganic material, covering the second encapsulation layer of the display region 100 and the circuit region 301, and covering the first encapsulation layer in the isolating dam region 302. That is, the encapsulation layer 26 of the display region 100 and the circuit region 301 has a laminated structure of an inorganic material/an organic material/an inorganic material, an organic material layer is disposed between two inorganic material layers, and the encapsulation layer 26 of the isolating dam region 302 has a laminated structure of inorganic material/inorganic material. In an exemplary embodiment, because a region of the isolating dam region 302 adjacent to the crack dam region 303 exposes a surface of the fifth insulation layer 15, thus two inorganic material layers of the isolating dam region 302 are directly formed on the fifth insulation layer 15, ensuring an encapsulation effect and process quality. In an exemplary embodiment, the preparation process of the display substrate may further include: peeling the display substrate from the glass carrier plate 1 through a peeling process, attaching a layer of back film to a back surface of the display substrate (a surface of the base substrate 10 on a side away from a film layer) using a roller bonding mode, cutting along a cutting groove using a cutting device, and the like, and a formed display substrate is shown in FIGS. 6a and 6b.

In an exemplary embodiment, the first insulation layer, the second insulation layer, the third insulation layer, the fourth insulation layer, and the fifth insulation layer may be made of any one or more of Silicon Oxide (SiOx), Silicon Nitride (SiNx), and Silicon OxyNitride (SiON), and may be a single layer, a multi-layer, or a composite layer. The first insulation layer is referred to as a buffer layer for improving capabilities of water-resistance and oxygen-resistance of the base substrate, the second insulation layer and the third insulation layer are referred to as Gate Insulators (GIs), the fourth insulation layer is referred to as an InterLayer Dielectric (ILD) layer, and the fifth insulation layer is referred to as a Passivation (PVX) layer. The first metal thin film, the second metal thin film, the third metal thin film, and the fourth metal thin film may be made of metal materials, such as any one or more of silver (Ag), copper (Cu), aluminum (Al), titanium (Ti), and molybdenum (Mo), or alloy materials of the above metals, such as AlNd alloy or MoNb alloy, and may be a single-layer structure or a multi-layer composite structure, such as Ti/Al/Ti. The transparent conductive thin film may include Indium Tin Oxide (ITO) or Indium Zinc Oxide (IZO). The Pixel Definition Layer may be made of polyimide, acrylic, polyethylene terephthalate, or the like. The active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene and other materials, that is, the present disclosure is applicable to transistors manufactured based on an oxide technology, a silicon technology, and an organic matter technology.

According to the exemplary embodiment of the present disclosure, the first power supply line 310 is formed through the first source drain metal layer, the auxiliary power supply line 320 is formed through the second source drain metal layer, and a multi-layer power supply line is formed in the first border region 300 and the corner region 250a; through a connection structure in which the auxiliary power supply line 320 crosses over a second isolating dam and is overlapped with the first power supply line 310, a multi-layer power supply wiring in a parallel structure is achieved, a resistance of a power supply wiring in the first border region 300 and the corner region 250a is reduced, voltage drop of a voltage signal is minimized to a maximum extent, and uniformity of display brightness of the display region is improved.

According to the exemplary embodiment of the present disclosure, the orthographic projection of the first power supply line 310 on the plane of the base substrate of the first border region 300 and the corner region 250a is at least partially overlapped with the orthographic projection of the plurality of data line leads 311 on the plane of the base substrate; on one hand, stress resistance of a corner region is improved; on the other hand, the first power supply line 310 may effectively prevent inward expansion of microcracks, thereby ensuring that microcracks generated during cutting do not affect a function of a circuit unit in a circuit region, and improving display quality of a display panel. The preparation process of the display substrate in the exemplary embodiment of the present disclosure has good process compatibility, simple process achievement, easy implementation, high production efficiency, a low production cost, and a high yield rate.

The present disclosure further provides a preparation method for a display substrate. In an exemplary embodiment, the preparation method may include: forming a display region and a non-display region surrounding the display region, wherein the non-display region includes a first border region at least partially surrounding the display region, a second border region and a lead convergence region located on a side of the display region, the lead convergence region is located between the first border region and the second border region, and the lead convergence region includes two corner regions (a first corner region and a second corner region) and an intermediate convergence region located between the two corner regions; forming a plurality of sub-pixels and a plurality of data lines arranged in an array in the display region, wherein the plurality of data lines are electrically connected with the plurality of sub-pixels; forming a first power supply line and a plurality of data line leads in the first border region and the lead convergence region, wherein the first power supply line at least partially surrounds the display region, the plurality of data line leads are electrically connected with the plurality of data lines; and forming at least two first power supply pins in the second border region, wherein the at least two first power supply pins are connected with the first power supply line, and an orthographic projection of the first power supply line on a plane of the base substrate of the first border region and the corner region is overlapped at least partially with an orthographic projection of the plurality of data line leads on the plane of the base substrate.

The present disclosure further provides a display apparatus including the display substrate in the aforementioned embodiments. The display apparatus may be any product or component with a display function, such as a mobile phone, a tablet computer, a television, a display, a notebook computer, a digital photo frame, or a navigator.

The drawings of the present disclosure only involve the structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present application.

The invention claimed is:

1. A display substrate, comprising:
   a base substrate, comprising a display region and a non-display region surrounding the display region, wherein the non-display region comprises a first border region at least partially surrounding the display region, a second border region and a lead convergence region located on a side of the display region, the lead convergence region is located between the first border region and the second border region, and the lead convergence region comprises a first corner region, a second corner region, and an intermediate convergence region located between the first corner region and the second corner region;
   a plurality of sub-pixels, located in the display region;
   a plurality of data lines, located in the display region and electrically connected with the plurality of sub-pixels;
   a plurality of data line leads, at least located in the first border region and the lead convergence region, and electrically connected with the plurality of data lines;
   a first power supply line, located in the first border region and the lead convergence region, wherein the first power supply line at least partially surrounds the display region; and
   at least two first power supply pins, located in the second border region, wherein the at least two first power supply pins are connected with the first power supply line,
   wherein an orthographic projection of the first power supply line on a plane of the base substrate of the first border region, the first corner region, and the second corner region is overlapped at least partially with an orthographic projection of the plurality of data line leads on the plane of the base substrate;
   wherein the first power supply line comprises a first boundary close to the display region and a second boundary away from the display region in the first border region and the first corner region;
   wherein the plurality of data line leads comprises a first data line lead group located in the first border region and the first corner region, and the first data line lead group comprises a third boundary close to the display region and a fourth boundary away from the display region; and
   wherein the fourth boundary is located on a side of the second boundary close to the display region, and a ratio of a width of the first power supply line to a maximum width of the plurality of data line leads ranges from 1.1 to 1.2.

2. The display substrate according to claim 1, wherein at least part of the third boundary is located on a side of the first boundary close to the display region, and a shortest distance between the first boundary and the third boundary is between 5 microns and 10 microns.

3. The display substrate according to claim 1, wherein a width of the first power supply line is between 200 and 350 microns.

4. The display substrate according to claim 1, wherein at least part of the first boundary is located on a side of the third boundary close to the display region, and a shortest distance between the first boundary and the third boundary is between 2 microns and 5 microns.

5. The display substrate according to claim 1, wherein the fourth boundary is located on a side of the second boundary close to the display region, and a shortest distance between the second boundary and the fourth boundary is between 10 microns and 25 microns.

6. The display substrate according to claim 1, wherein the first boundary is located on a side of the third boundary close to the display region, and the second boundary is located on a side of the fourth boundary away from the display region.

7. The display substrate according to claim 1, wherein the first power supply line further comprises a fifth boundary close to the display region and a sixth boundary away from the display region in the first border region and the second corner region;

the plurality of data line leads further comprise a second data line group located in the first border region and the second corner region, and the second data line lead group comprises a seventh boundary close to the display region and an eighth boundary away from the display region.

8. The display substrate according to claim 7, wherein the display region comprises a centerline, the centerline is a straight line extending along a first direction and equally dividing the display region, and the second data line group and the first data line group are disposed symmetrically with respect to the centerline.

9. The display substrate according to claim 7, wherein at least part of the seventh boundary is located on a side of the fifth boundary close to the display region, and a shortest distance between the seventh boundary and the fifth boundary is between 5 microns and 10 microns.

10. The display substrate according to claim 7, wherein at least part of the fifth boundary is located on a side of the seventh boundary close to the display region, and a shortest distance between the fifth boundary and the seventh boundary is between 2 microns and 5 microns.

11. The display substrate according to claim 7, wherein the eighth boundary is located on a side of the sixth boundary close to the display region, and a shortest distance between the sixth boundary and the eighth boundary is between 10 microns and 25 microns.

12. The display substrate according to claim 7, wherein the eighth boundary is located on a side of the sixth boundary close to the display region, and a ratio of a width of the first power supply line to a maximum width of the plurality of data line leads ranges from 1.1 to 1.2.

13. The display substrate according to claim 7, wherein the fifth boundary is located on a side of the seventh boundary close to the display region, and the sixth boundary is located on a side of the eighth boundary away from the display region.

14. The display substrate according to claim 1, wherein in a direction perpendicular to the display substrate, the display substrate comprises the base substrate, and a drive circuit layer, a light emitting structure layer, and an encapsulation layer that are stacked on the base substrate, the drive circuit layer comprises an active layer, a first gate metal layer, a second gate metal layer, a first source drain metal layer, and a second source drain metal layer that are stacked on the base substrate; and the light emitting structure layer comprises an anode, a cathode, and an organic light emitting layer disposed between the anode and the cathode; and the data line leads are disposed in a same layer as one or more of the first gate metal layer and the second gate metal layer, and the first power supply line is disposed in a same layer as at least one of the first source drain metal layer, the second source drain metal layer, and the anode.

15. The display substrate according to claim 14, wherein the data line leads comprise a first data line lead and a second data line lead disposed alternately along a direction away from the display region, the first data line lead is disposed in a same layer as the first gate metal layer, the second data line lead is disposed in a same layer as the second gate metal layer, and an orthographic projection of the first data line lead on the plane of the base substrate is not overlapped with an orthographic projection of the second data line lead on the plane of the base substrate.

16. The display substrate according to claim 1, wherein the first border region and the lead convergence region further comprise a isolating dam surrounding the display region, the isolating dam comprises a first isolating dam and a second isolating dam, a distance between the first isolating dam and an edge of the display region is less than a distance between the second isolating dam and the edge of the display region, and orthographic projections of the first isolating dam and the second isolating dam on the plane of the base substrate is at least partially within a range of the orthographic projection of the first power supply line on the plane of the base substrate.

17. The display substrate according to claim 1, further comprising a second power supply line located in the lead convergence region and the second border region, and an orthographic projection of the second power supply line on the plane of the base substrate of the lead convergence region is overlapped at least partially with the orthographic projection of the plurality of data line leads on the plane of the base substrate.

18. A display apparatus, comprising a display substrate according to claim 1.

* * * * *